(12) United States Patent
Yoon et al.

(10) Patent No.: US 9,449,986 B1
(45) Date of Patent: Sep. 20, 2016

(54) 3-DIMENSIONAL MEMORY DEVICE HAVING PERIPHERAL CIRCUIT DEVICES HAVING SOURCE/DRAIN CONTACTS WITH DIFFERENT SPACINGS

(71) Applicants: Hyun Sook Yoon, Anyang-si (KR); Jang Gn Yun, Hwaseong-si (KR); Sun Young Kim, Seongnam-si (KR); Jae Ho Jeong, Suwon-si (KR)

(72) Inventors: Hyun Sook Yoon, Anyang-si (KR); Jang Gn Yun, Hwaseong-si (KR); Sun Young Kim, Seongnam-si (KR); Jae Ho Jeong, Suwon-si (KR)

(73) Assignee: SAMSUNG ELECTRONICS CO., LTD., Samsung-ro, Yeongtong-gu, Suwon-si, Gyeonggi-do (KR)

(*) Notice: Subject to any disclaimer, the term of this patent is extended or adjusted under 35 U.S.C. 154(b) by 0 days.

(21) Appl. No.: 14/975,876

(22) Filed: Dec. 21, 2015

Related U.S. Application Data

(60) Provisional application No. 62/241,070, filed on Oct. 13, 2015.

(30) Foreign Application Priority Data

Nov. 2, 2015 (KR) ........................ 10-2015-0153275

(51) Int. Cl.
*H01L 27/115* (2006.01)
*H01L 29/788* (2006.01)
*H01L 29/792* (2006.01)
*H01L 29/423* (2006.01)
*H01L 23/528* (2006.01)

(52) U.S. Cl.
CPC ....... *H01L 27/11582* (2013.01); *H01L 23/528* (2013.01); *H01L 27/1158* (2013.01); *H01L 27/11519* (2013.01); *H01L 27/11521* (2013.01); *H01L 27/11526* (2013.01); *H01L 27/11556* (2013.01); *H01L 27/11565* (2013.01); *H01L 27/11568* (2013.01); *H01L 27/11573* (2013.01); *H01L 27/11575* (2013.01); *H01L 29/4234* (2013.01); *H01L 29/42324* (2013.01); *H01L 29/7889* (2013.01); *H01L 29/7926* (2013.01)

(58) Field of Classification Search
None
See application file for complete search history.

(56) References Cited

U.S. PATENT DOCUMENTS

| | | | |
|---|---|---|---|
| 5,831,316 A | 11/1998 | Yu et al. | |
| 7,764,077 B2 | 7/2010 | Naruta | |
| 7,821,138 B2 | 10/2010 | Yamada et al. | |
| 7,898,041 B2 | 3/2011 | Radosavljevic et al. | |
| 8,193,608 B2 | 6/2012 | Yabu et al. | |
| 8,384,161 B2 | 2/2013 | Richter et al. | |
| 8,541,885 B2 | 9/2013 | Gerhardt et al. | |
| 2009/0267128 A1* | 10/2009 | Maejima ........... | H01L 27/11565 257/314 |

(Continued)

FOREIGN PATENT DOCUMENTS

| | | |
|---|---|---|
| JP | 10-173065 | 6/1998 |
| JP | 2013-232135 | 11/2013 |

(Continued)

*Primary Examiner* — Michael Jung
(74) *Attorney, Agent, or Firm* — Muir Patent Law, PLLC

(57) ABSTRACT

A memory device includes a cell region including a channel region extending to be perpendicular to an upper surface of a substrate, a plurality of gate electrode layers stacked on the substrate adjacently to the channel region, a peripheral circuit region including a first active region disposed in the vicinity of the cell region, a second active region having an area larger than an area of the first active region, a plurality of first contacts connected to the first active region, and a plurality of second contacts connected to the second active region. A distance between the plurality of first contacts is less than that between the plurality of second contacts.

21 Claims, 23 Drawing Sheets

(56) References Cited

U.S. PATENT DOCUMENTS

2011/0284946 A1\* 11/2011 Kiyotoshi ....... H01L 27/115635
　　　　　　　　　　　　　　　　　　　　　257/324
2015/0035056 A1\* 2/2015 Kuwazawa ......... H01L 29/7816
　　　　　　　　　　　　　　　　　　　　　257/343
2015/0294977 A1\* 10/2015 Kim .................. H01L 27/11573
　　　　　　　　　　　　　　　　　　　　　257/314
2015/0340374 A1\* 11/2015 Jung ................... H01L 27/1531
　　　　　　　　　　　　　　　　　　　　　438/258

FOREIGN PATENT DOCUMENTS

| KR | 10-2004-0010872 A | 2/2004 |
| KR | 10-2005-0028100 A | 3/2005 |
| KR | 10-2006-0038584 A | 5/2006 |

\* cited by examiner

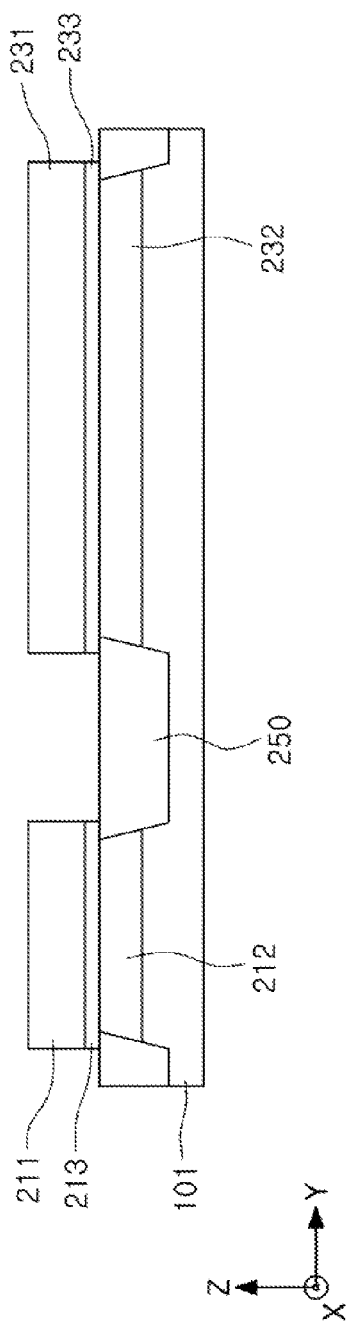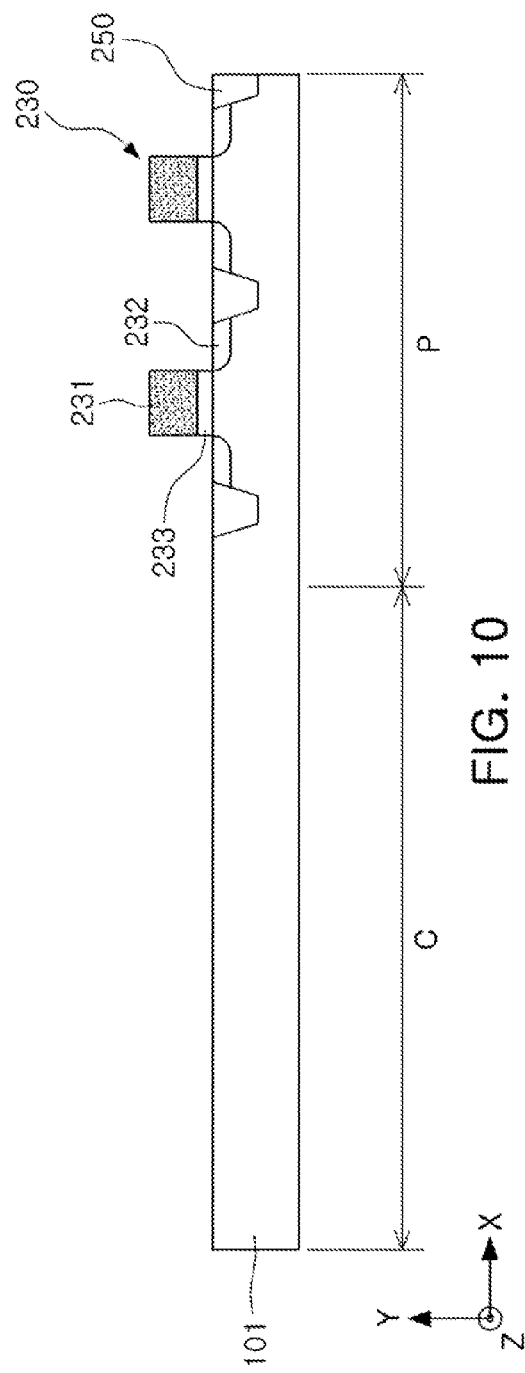

3-DIMENSIONAL MEMORY DEVICE HAVING PERIPHERAL CIRCUIT DEVICES HAVING SOURCE/DRAIN CONTACTS WITH DIFFERENT SPACINGS

CROSS-REFERENCE TO RELATED APPLICATIONS

This application claims the priorities to and benefits of U.S. Provisional Application No. 62/241,070, filed on Oct. 13, 2015 with the United States Patent and Trademark Office, and Korean Patent Application No. 10-2015-0153275, filed on Nov. 2, 2015 with the Korean Intellectual Property Office, the disclosures of which are incorporated herein by reference in their entirety.

BACKGROUND

The present disclosure relates to a memory device.

Volumes of electronic products have gradually been reduced, while being designed to process high capacity data. Thus, the integration of semiconductor memory devices used in such electronic products has been increasing. As a method in which to increase the integration of semiconductor memory devices, a memory device having a vertical transistor structure rather than having a planar transistor structure has been proposed.

SUMMARY

Aspects of the present embodiments provide a memory device having a vertical structure in which device reliability may be improved by preventing breakage of an interlayer insulating layer.

According to certain embodiments, a memory device may include a cell region including memory cells, the cell region including a plurality of channel structures each extending vertically from an upper surface of a substrate, and a plurality of gate electrode layers stacked on the substrate adjacently to the plurality of channel structures. The memory device may further include a peripheral circuit region including peripheral circuits for the memory cells, the peripheral circuit region formed on the substrate, and including a first active region, a second active region having an area larger than an area of the first active region, a plurality of first contacts connected to the first active region, and a plurality of second contacts connected to the second active region. A distance between adjacent first contacts of the plurality of first contacts may be less than a distance between adjacent second contacts of the plurality of second contacts.

According to certain embodiments, a memory device may include a plurality of memory cells stacked on an upper surface of the substrate to forma three-dimensional (3D) memory cell array, a first active region and a second active region disposed on the substrate outside of the memory cell array, a plurality of first vertical contacts forming a row of first contacts and connected to the first active region, wherein the plurality of first contacts are arranged a first distance apart from each other, and a plurality of second vertical contacts forming a row of second contacts and connected to the second active region. The plurality of second contacts may be arranged a second distance apart from each other, the second distance greater than the first distance.

According to certain embodiments, a memory device may include a substrate, a channel region extending vertically from an upper surface of the substrate, a plurality of gate electrode layers adjacent to the channel region and vertically stacked on each other on the substrate, a plurality of peripheral circuit devices disposed on the substrate outside of a memory cell region that includes the plurality of gate electrode layers, and an interlayer insulating layer on the plurality of gate electrode layers and the plurality of peripheral circuit devices. The plurality of peripheral circuit devices may include a first peripheral circuit device smaller than a predetermined reference size and a second peripheral circuit device larger than the predetermined reference size, and a distance between adjacent contacts of a plurality of first contacts connected to the first peripheral circuit device may be less than a distance between adjacent contacts of a plurality of second contacts connected to the second peripheral circuit device.

In certain of these embodiments, cell region, memory cells, and/or channel region may be part of a three-dimensional (3D) memory cell array. For example, the array may include pillar-shaped active regions and stacked gate layers. An interlayer insulating layer may cover the 3D memory cell array as well as peripheral devices. Active area contacts may be arranged rows or lines having different distances between adjacent active area contacts in different active areas.

BRIEF DESCRIPTION OF DRAWINGS

The above and other aspects, features, and advantages of the present inventive concept will be more clearly understood from the following detailed description taken in conjunction with the accompanying drawings, in which:

FIGS. 8 to 23 are drawings illustrating a method of manufacturing a memory device illustrated in FIGS. 3 to 5 according to certain exemplary embodiments of the present inventive concept.

DETAILED DESCRIPTION

Figure 1:
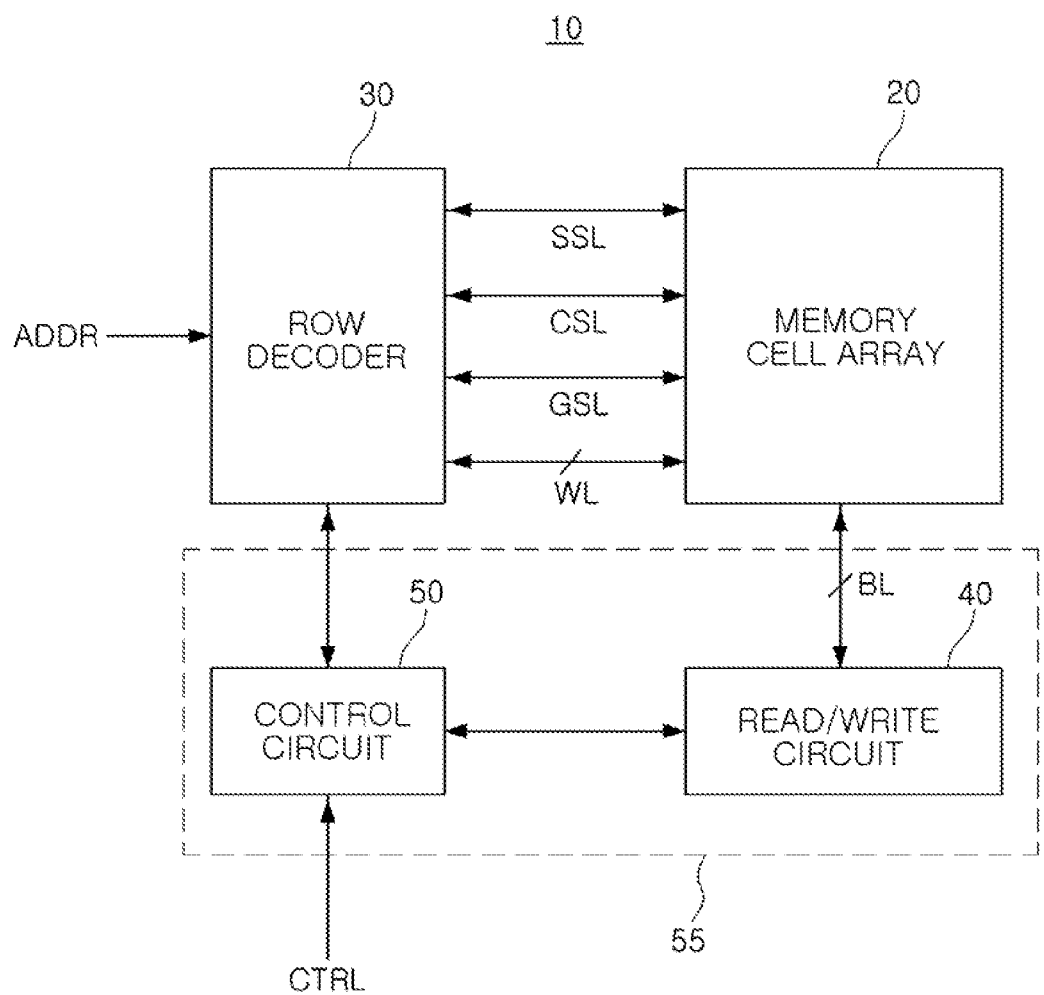
FIG. 1 is a schematic block diagram of a memory device according to certain exemplary embodiments of the present inventive concept.

Hereinafter, embodiments of the present inventive concept will be described as follows with reference to the attached drawings.

In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

The present inventive concept may be exemplified in many different forms and should not be construed as being limited to the specific embodiments set forth herein.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there are no elements or layers intervening therebetween. Other words used to describe the relationship between elements should be interpreted in a like fashion (e.g., "between" versus "directly between," "adjacent" versus "directly adjacent," etc.). However, the term "contact," as used herein refers to direct contact (i.e., touching) unless the context indicates otherwise.

As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. Unless the context indicates otherwise, these terms are only used to distinguish one member, component, region, layer or section from another region, layer or section. Thus, a first member, component, region, layer or section discussed below in one section of the specification or claims could be termed a second member, component, region, layer or section in another section of the specification or claims without departing from the teachings of the exemplary embodiments. In addition, in certain cases, even if a term is not described using "first," "second," etc., in the specification, it may still be referred to as "first" or "second" in a claim in order to distinguish different claimed elements from each other.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting of the present inventive concept. As used herein, the singular forms "a," "an," and "the" are intended to include the plural forms as well, unless the context clearly indicates otherwise. It will be further understood that the terms "includes," "including," "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present inventive concept will be described with reference to schematic views illustrating embodiments of the present inventive concept. In the drawings, for example, due to manufacturing techniques and/or tolerances, modifications of the shape shown may be estimated. Thus, embodiments of the present inventive concept should not be construed as being limited to the particular shapes of regions shown herein, for example, to include a change in shape results in manufacturing.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

The contents of the present embodiments described below may have a variety of configurations and the disclosure herein proposes only exemplary configurations, but is not limited thereto.

With reference to FIG. 1, a semiconductor device 10 according to an exemplary embodiment of the present inventive concept may include a memory cell array 20, a row decoder 30, and a core logic circuit 55. The core logic circuit 55 may include a read/write circuit 40 and a control circuit 50. As used herein, a semiconductor device may refer, for example, to an array of transistors or memory cells or a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

The memory cell array 20 may include a plurality of memory cells arranged in a plurality of rows and a plurality of columns. The plurality of memory cells included in the memory cell array 20 may be connected to the row decoder 30, for example, through a word line WL, a common source line CSL, a string select line SSL, a ground select line GSL, and the like, and may be connected to the read/write circuit 40 through a bit line BL. In exemplary embodiments, a plurality of memory cells arranged linearly in a single row may be connected to a single word line WL, and a plurality of memory cells arranged linearly in a single column may be connected to a single bit line BL.

The plurality of memory cells included in the memory cell array 20 may be divided into a plurality of memory blocks. Each memory block may include a plurality of word lines WL, a plurality of string select lines SSL, a plurality of ground select lines GSL, a plurality of bit lines BL, and at least one common source line CSL.

The row decoder 30 may receive an address information ADDR provided externally (e.g., from a device external to the semiconductor device 10), and may decode the address information ADDR to select at least a portion of the word lines WL, the common source line CSL, the string select line SSL, and the ground select line GSL connected to the memory cell array 20.

The read/write circuit 40 may select at least a portion of bit lines BL connected to the memory cell array 20 in response to a command provided from the control circuit 50. The read/write circuit 40 may read data from a memory cell connected to the selected bit lines BL or may write data to a memory cell connected to the selected bit lines BL. In order to perform operations as described above, the read/write circuit 40 may include a circuit such as a page buffer, an input/output buffer, a data latch, and the like.

The control circuit 50 may control operations of the row decoder 30 and the read/write circuit 40 in response to a control signal CTRL transferred externally (e.g., from a device external to the semiconductor device 10). In the case of reading data from the memory cell array 20, the control circuit 50 may control operations of the row decoder 30 to supply a voltage to the word line WL in which the data to be read is stored for a read operation. When the voltage for a read operation is supplied to a specific word line WL, the control circuit 50 may control the read/write circuit 40 so that the read/write circuit 40 may read data written to a memory cell connected to the word line WL having received the voltage for a read operation.

In a different manner, for example, when data is written to the memory cell array 20, the control circuit 50 may control operations of the row decoder 30 to supply a voltage for a writing operation to a word line WL to which the data is to be written. When the voltage for a writing operation is supplied to a specific word line WL, the control circuit 50 may control the read/write circuit 40 to write data to a memory cell connected to the word like WL to which the voltage for a writing operation has been supplied.

Figure 2:
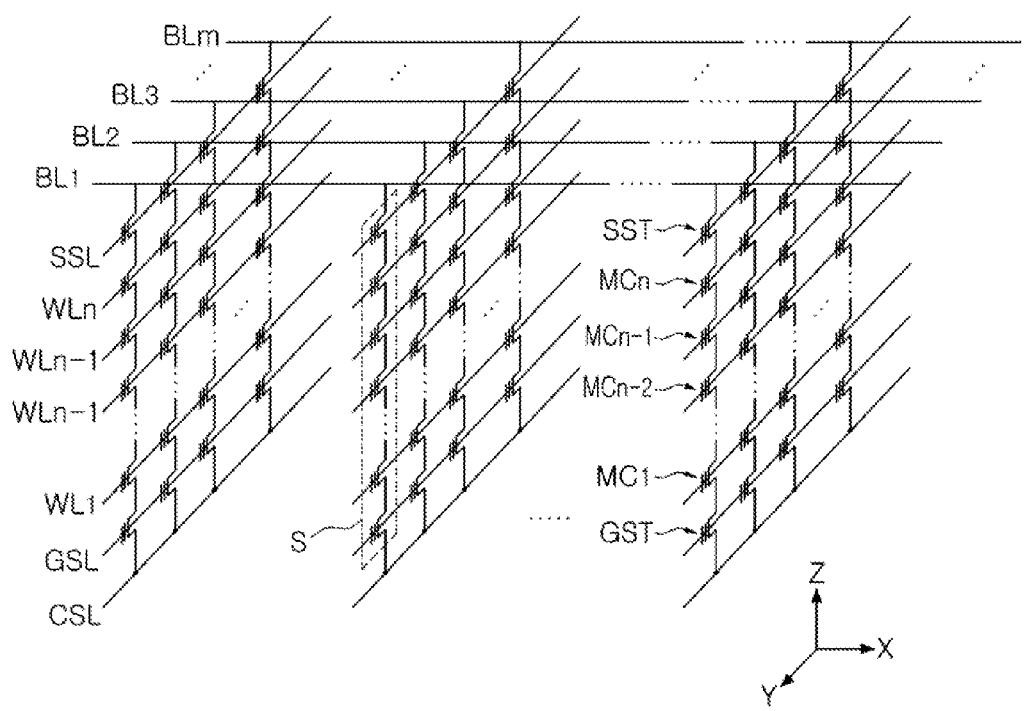
FIG. 2 is a circuit diagram of a memory cell array of a memory device according to certain exemplary embodiments of the present inventive concept.

FIG. 2 is an equivalent circuit diagram of a memory cell array of a memory device according to an exemplary embodiment of the present inventive concept. A semiconductor device according to an exemplary embodiment may be a vertical NAND flash device.

Referring to FIG. 2, a memory cell array may include a plurality of memory cell strings S including n number of memory cells MC1 to MCn connected to one another in series, and a ground selection transistor GST and a string selection transistor SST respectively connected to two opposite ends of the n number of memory cells MC1 to MCn in series.

The n number of memory cells MC1 to MCn connected to each other in series may be connected to n number of word lines WL1 to WLn to select the memory cells MC1 to MCn, respectively.

Gate terminals of the ground selection transistors GST may be connected to a ground select line GSL, and source terminals thereof may be connected to a common source line CSL. In a different manner, gate terminals of the string selection transistors SST may be connected to a string select line SSL, and source terminals thereof may be connected to drain terminals of memory cells MCn. Although FIG. 2 illustrates a structure in which one ground selection transistor GST and one string selection transistor SST are respectively connected to the n number of memory cells MC1 to MCn connected to one another in series, in a manner different therefrom, a plurality of ground selection transistors GST or a plurality of string selection transistors SST may be connected thereto.

Drain terminals of the string selection transistors SST may be connected to a plurality of bit lines BL1 to BLm. When a signal is applied to gate terminals of the string selection transistors SST through the string select line SSL, the signal applied through the bit lines BL1 to BLm may be transferred to the n number of memory cells MC1 to MCn connected to one another in series, and thus a data reading operation or a data writing operation may be performed. In addition, as a signal is applied to a gate terminal of the gate selection transistor GST of which a source terminal is connected to the common source line CSL, via the gate selection line, an erase operation in which charges stored in the n number of memory cells MC1 to MCn are together removed may be performed.

Figure 3:
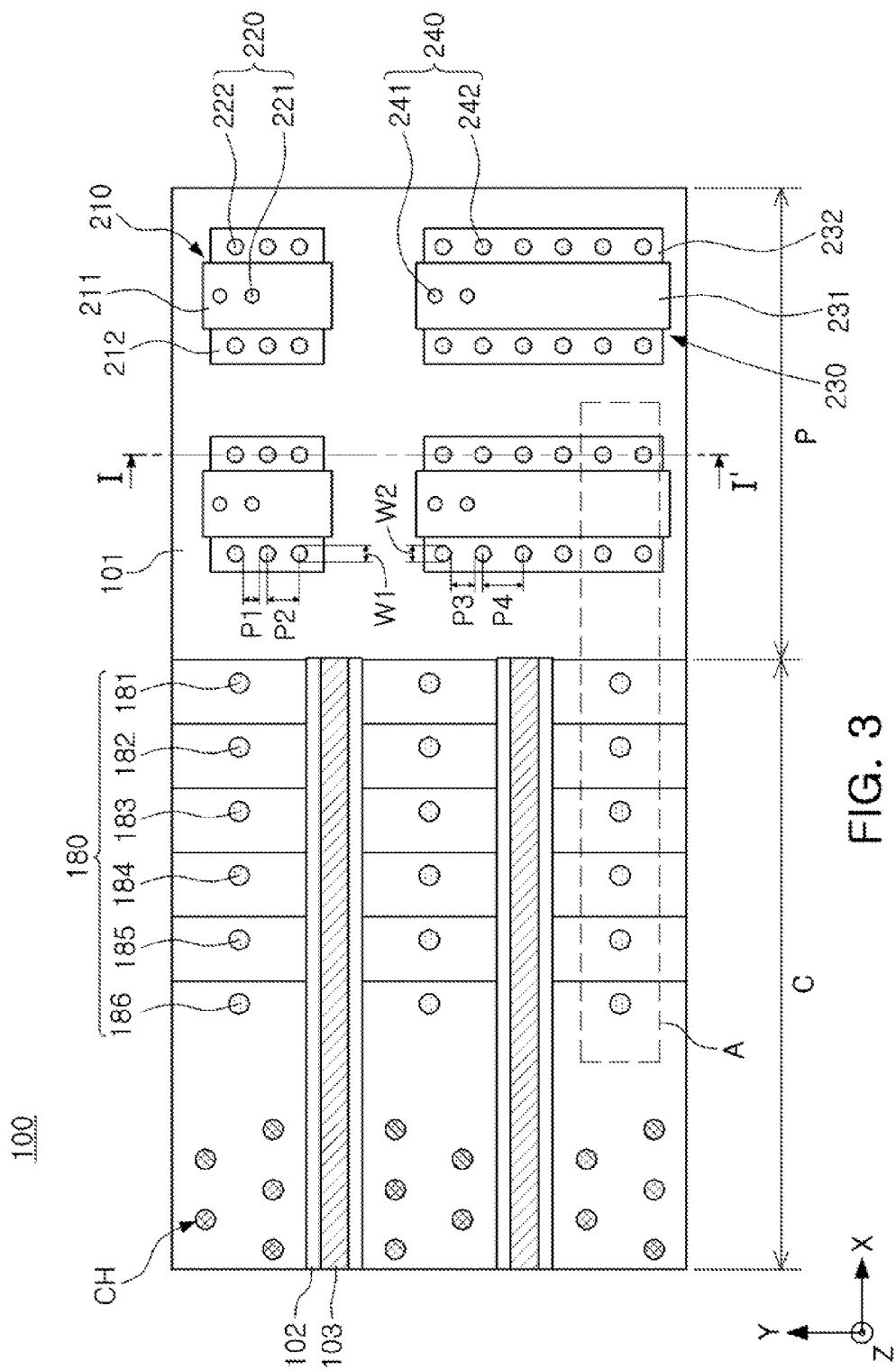
FIG. 3 is a plan view of a memory device according to certain exemplary embodiments of the present inventive concept.

FIG. 3 is a plan view of a memory device according to an exemplary embodiment of the present inventive concept.

With reference to FIG. 3, a memory device 100 according to an exemplary embodiment of the present inventive concept may include a cell region C and a peripheral circuit region P. The cell region C may include channel regions CH extending in a direction perpendicular to an upper surface of a substrate 101 (e.g., extending vertically from the substrate), a plurality of cell contacts 181 to 186 connected to a plurality of gate electrode layers stacked on the substrate 101 adjacently to the channel regions CH, and the like. The peripheral circuit region P may include a plurality of peripheral contacts 220 and 240 connected to peripheral circuit devices 210 and 230 disposed on the substrate 101. The substrate 101 may be a substrate of a single die, for example, formed from a semiconductor wafer. As such, the cell region C and peripheral circuit region P may be part of the same semiconductor chip. In the cell region C, the channel regions CH and the gate electrode layer may be divided into a plurality of regions by isolation insulating layers 102. For example, a plurality of channel regions CH may form a set of channel regions, and a plurality of sets of channel regions may be formed. An individual channel region formed by one vertical pillar may be referred to herein as a channel pillar, or a channel structure. A plurality of channel pillars extending vertically from the substrate 101 may form a set of channel regions.

An upper surface of the substrate 101 may correspond to an X-Y plane, and the channel regions CH and the plurality of cell contacts 180, for example, cell contacts 181 to 186, may extend in a direction, for example, a z-axis direction of FIG. 3, perpendicular to an upper surface of the substrate 101. The plurality of gate electrode layers connected to the plurality of cell contacts 181 to 186 may be stacked on an upper surface of the substrate 101 parallel to the X-Y plane, in the Z-axis direction.

The channel regions CH may be spaced apart from each other on the X-Y plane. The number and disposition of channel regions CH may vary according to exemplary embodiments. For example, as illustrated in FIG. 3, the channel regions CH may be disposed in a zig-zag form. In addition, the sets of channel regions CH adjacent to each other with the isolation insulating layer 102 therebetween may be symmetrical to each other, respectively, but are not limited thereto.

The plurality of gate electrode layers and channel regions CH, and the like, may be divided into a plurality of regions by common source lines 103 and the isolation insulating layers 102 disposed in the vicinity of the common source lines 103 (e.g., disposed adjacent to the common source lines 103). The plurality of regions defined by the common source lines 103 and the isolation insulating layers 102 (e.g., a set of channel pillars between two source lines 103) may be respectively provided as a unit cell of the memory device 100. A source region may be disposed below the common source line 103 in the Z-axis direction.

An interlayer insulating layer may be arranged on the substrate 101 over the entirety of the cell region C and the peripheral circuit region P. The interlayer insulating layer may be an insulating layer covering the plurality of gate electrode layers, the peripheral circuit devices 210 and 230, and the like, and may include a silicon oxide or a silicon nitride, and the like. FIG. 3 illustrates a form from which the interlayer insulating layer is omitted in order to explain the internal structure of the memory device 100 in further detail.

The peripheral circuit devices 210 and 230 may include a planar transistor, and may respectively include an active region 212 or 232 provided as a drain region or a source region, or the like, a planar gate electrode layer 211 or 231, and the like. The active regions 212 and 232 may be formed by implanting impurities into portions of the substrate 101, and the active regions 212 and 232 and the planar gate electrode layers 211 and 231 may intersect each other, respectively. The active regions 212 and 232 and the planar gate electrode layers 211 and 231 may be connected to the plurality of peripheral contacts 220 and 240, respectively.

The plurality of peripheral contacts may include first peripheral contacts 220 connected to a first peripheral circuit device 210, and second peripheral contacts 240 connected to a second peripheral circuit device 230, respectively. The first peripheral contacts 220 may include first gate contacts 221 connected to the first planar gate electrode layer 211, and first active contacts 222 connected to the first active region 212. In addition, the second peripheral contact 240 may include second gate contacts 241 connected to the second planar gate electrode layer 231 and second active contacts 242 connected to the second active region 232. The peripheral contacts and gate contacts described herein may be vertical pillars, referred to as conductive pillars, or pillar contacts. Each of these pillars may extend, for example, from a top of an interlayer insulating layer to the gate or active region which they contact. Each pillar may connect at its top to a conductive line or conductive pad. The vertical pillars may be formed in rows, each row including, for example, 2, 3, or more pillars, as shown in the various figures. In certain exemplary embodiments, a first active region 212 may form part of a first transistor having a first source and a first drain, and a second active region 232 may form part of a second transistor having a second source and a second drain. A plurality of first contacts as discussed in various embodiments herein may be formed on one of the first source and the first drain, and a plurality of second contacts may be formed on one of the second source and the second drain.

In the memory device 100 according to an exemplary embodiment, distances between active contacts of the first active contacts 222 and distances between active contacts of the second active contacts 242, and the number of the active contacts, may be determined depending on the sizes of the active regions 212 and 232, respectively. In an exemplary embodiment such as illustrated in FIG. 3, the size of the first active region 212 may be smaller than the size of the second active region 232 (e.g., a length in a Y-direction and/or an area in an X-Y direction of the first active region 212 viewed from an overhead view may be smaller than a length in the Y-direction and/or an area in an X-Y direction of the second active region 232 viewed from the overhead view). The first active region 212 may form the entire active region of the first peripheral device 210 (e.g., to include a source, drain, and channel region therebetween), and the second active region 232 may form the entire active region of the second peripheral device 230 (e.g., to include a source, drain, and channel region therebetween. The number of active contacts of the first active region 212 may be less than the number of active contacts of the second active region 232. In some embodiments, the number of active contacts in the first active region 212 may be the same as the number of active contacts in the second active region 232. In addition, a distance P1 between active contacts of the first active contacts 222 connected to the first active region 212 (e.g., between two adjacent active contacts) may be less than a distance P3 between active contacts of the second active contacts 242 (e.g., between two adjacent active contacts) connected to the second active region 232.

In general, in the case of peripheral circuit devices having an active region of a relatively large area, the number of contacts connected to a single active region may be relatively increased. In some cases, distances between contacts connected to a single active region may be uniform regardless of an active region size. In these cases, cracks may occur in an interlayer insulating layer between active contacts due to stress applied to a region between active contacts connected to a relatively large active region.

However, as shown in FIG. 3, for example, in order to reduce such problems, distances between active contacts of the first active contacts 222 and distances between active contacts of the second active contacts 242 may be different from each other according to sizes of the active regions 212 and 232. For example, the active contacts 222 and 242 may be formed in such a manner that the distance P3 between adjacent active contacts of the second active contacts 242 (e.g., in a Y-direction, or a direction along the length of the gate electrode layer 211) may be greater than the distance P1 between adjacent active contacts of the first active contacts 222 (e.g., in the same direction), as illustrated in the example of FIG. 3. Thus, the occurrence of cracks in an interlayer insulating layer between adjacent active contacts of the second active contacts 242 may be prevented. As a result, active contacts 222 corresponding to the smaller active region 212 may be arranged more densely per distance or area than active contacts 242 corresponding to the larger active region 232. Distances between adjacent active contacts 222 in the Y-direction in the smaller peripheral circuit device 210 may be shorter than distances between adjacent active contacts 242 in the Y-direction in the larger peripheral circuit device 230.

In some embodiments, respective widths W1 and W2 of the first and second active contacts 222 and 242 (e.g., when viewed from an overhead view) may be substantially equal to each other. Since distances between active contacts of the first active contacts 222 and between active contacts of the second active contacts 242 having the same width are different from each other, a distance P2 between centers of adjacent first active contacts 222 may also be less than a distance P4 between centers of adjacent second active contacts 242. According to an exemplary embodiment, the widths W2 of the second active contacts 242 formed while having a relatively great distance between adjacent second active contacts may be greater than the widths W1 of the first active contacts 222 due to a difference occurring during a manufacturing process. Distances between centers of adjacent active contacts, such as illustrated as P2 and P4 in FIG. 3, may be described as a pitch.

When a distance between adjacent second active contacts 242 connected to the second peripheral circuit device 230 larger than the first peripheral circuit device 210 is determined, current characteristics of the second peripheral circuit device 230 may be considered. The current characteristics of the second peripheral circuit device 230 may be improved as the number of the second active contacts 242 connected to the second active region 232 is increased, while a distance between the second active contacts 242 may be reduced when the number of the second active contacts 242 is increased. In some cases, however, cracks may easily occur in an interlayer insulating layer.

Thus, the number of the second active contacts 242 and the distance between the second active contacts 242 may be determined so that the occurrence of cracks in the interlayer insulating layer may be suppressed, and simultaneously, the current characteristics of the second peripheral circuit device 230 may not be deteriorated due to decrease of the number of the second active contacts 242. According to an exemplary embodiment of the present inventive concept, a reference size for the plurality of peripheral circuit devices 210 and 230 disposed in the peripheral circuit region P may be set, and a distance between the active contacts 222 or between the active contacts 242 connected to the peripheral circuit devices 210 and 230 exceeding the reference size may be relatively increased, thereby preventing the occurrence of cracks in the interlayer insulating layer.

Hereinafter, the memory device 100 according to an exemplary embodiment of the present inventive concept will be described together with reference to FIG. 4.

Figure 4:
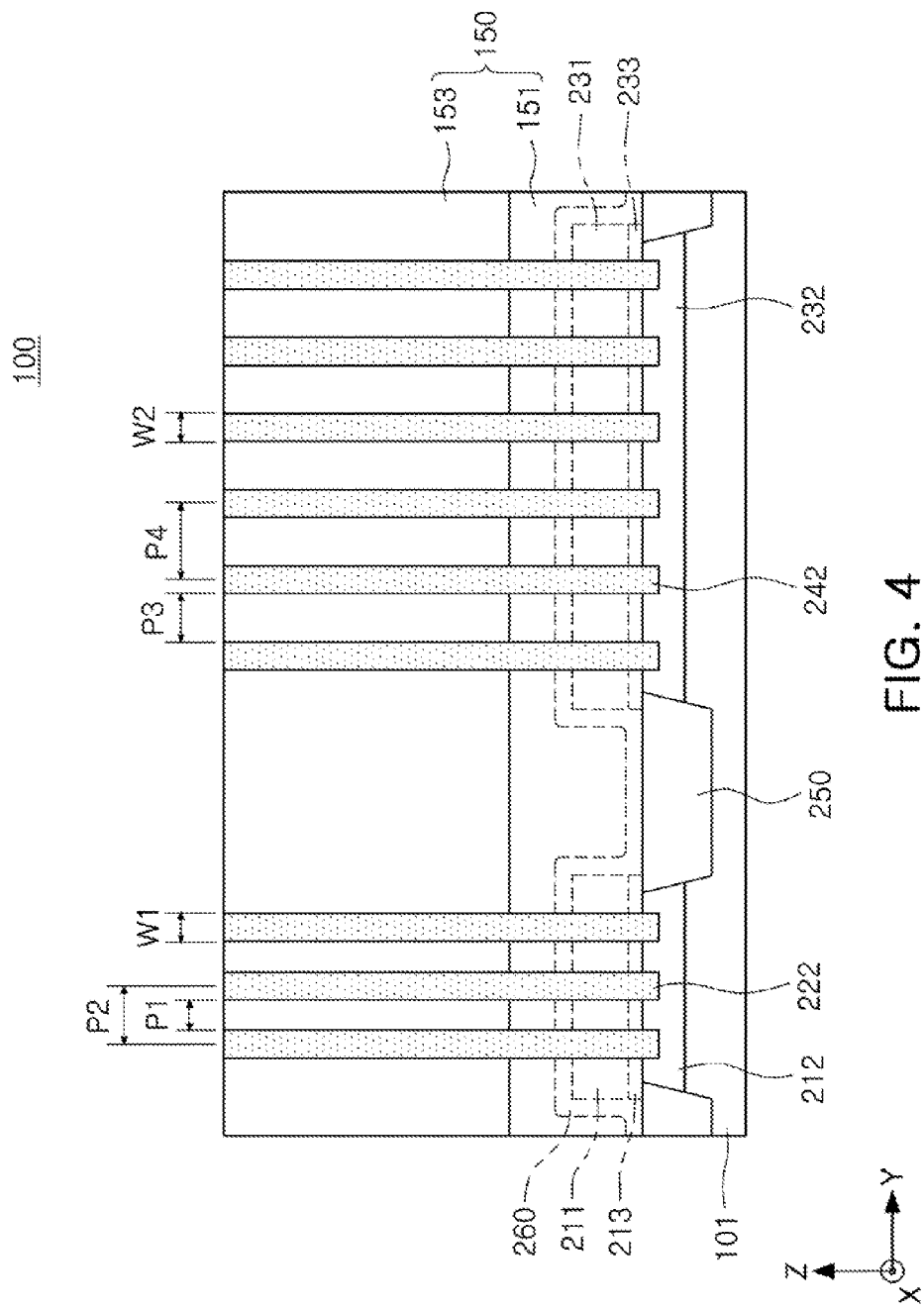
FIG. 4 is a cross-sectional view of a memory device taken along line I-I' of FIG. 3 according to certain exemplary embodiments of the present inventive concept.

FIG. 4 is a cross-sectional view of the memory device taken along line I-I' of FIG. 3 according to certain exemplary embodiments of the present inventive concept.

With reference to FIGS. 3 and 4, the memory device 100 according to an exemplary embodiment of the present inventive concept may include a plurality of peripheral circuit devices 210 and 230 disposed in the peripheral circuit region P, active contacts 222 and 242 (also referred to herein as active region contacts) respectively connected to the active regions 212 and 232 of the peripheral circuit devices 210 and 230, and the like. The peripheral circuit devices 210 and 230 may include planar gate electrode layers 211 and 231, active regions 212 and 232, and planar gate insulating layers 213 and 233, and the like, respectively. A device isolation layer 250 may be disposed externally from the active regions 212 and 232, respectively.

The active regions 212 and 232 may be formed by implanting an impurity into a region excluding the device isolation layer 250. The planar gate electrode layers 211 and 231 may be formed of a conductive material such as poly crystalline silicon, metal silicide, or the like, and the planar gate insulating layers 213 and 233, formed of an insulative material, may be disposed between the planar gate electrode layers 211 and 231 and the substrate 101, respectively. Active region 212 may include two sub-regions each on an opposite side of a gate electrode formed by gate electrode layer 211. Active region 232 may include two sub-regions each on an opposite side of a gate electrode formed by gate electrode layer 231. Each of these sub-regions may form a source or drain region. Each active region may also include a channel region between the source and drain region.

In the peripheral circuit region P, an interlayer insulating layer 150 including first and second interlayer insulating layers 151 and 153 may be arranged on the substrate 101. The first interlayer insulating layer 151 may fill a space between the peripheral circuit devices 210 and 230, and may include, for example, a high-density plasma (HDP) oxide layer. The second interlayer insulating layer 153 may be disposed over the peripheral circuit region P and the cell region C, and may include, for example, a tetra-ethly-orthosilicate (TEOS) oxide layer.

The active regions 212 and 232 of the peripheral circuit devices 210 and 230 may be connected to the active contacts 222 and 242, respectively. The active contacts 222 and 242 may penetrate through the interlayer insulating layer 150 to be connected to the active regions 212 and 232, respectively. Although the active contacts 222 and 242 are illustrated as having a uniform width in the exemplary embodiment of the present inventive concept of FIG. 4, the active contacts 222 and 242 may actually have a shape in which the widths of the active contacts are narrowed toward the substrate 101 (e.g., a tapered shape). The active contacts 222 and 242, which may be conductive contacts also referred to as plugs or pillars, may be formed, for example, of a conductive material such as a metal, poly crystalline silicon, metal silicide, or the like. The first active region 212 may have a size (e.g., area when viewed from an overhead view) smaller than that of the second active region 232, and the distance P1 between adjacent first active contacts 222 connected to the first active region 212 (e.g., on one side of the gate electrode layer 211) may be less than the distance P3 between adjacent second active contacts 242 connected to the second active region 232 (e.g., on one side of the gate electrode layer 231), for example in the Y-direction as shown in FIG. 4.

As described above, in a case in which the active contacts 222 and 242 are connected to the active regions 212 and 232 at the same distance, respectively, without adjusting a distance therebetween, cracks may occur more readily in the interlayer insulating layer 150 between the second active contacts 242. Therefore, in exemplary embodiments, the distance P3 between adjacent active contacts of the second active contacts 242 may be greater than the distance P1 between adjacent active contacts of the first active contacts 222, and thus, the occurrence of cracks in the interlayer insulating layer 150 between the second active contacts 242 may be reduced or prevented.

According to certain exemplary embodiments, a ratio of a width W2 of a second active contact 242 to the distance P3 between adjacent active contacts of the second active contacts 242 may be arranged to be within a range of 1:1.5 to 1:3. As such, the distance P3 may be between about 1.5 to 3 times the width W2. In certain exemplary embodiments, a ratio of a width W1 of a first active contact 222 to the distance P1 between adjacent active contacts of the first active contacts 222 may be arranged to be within a range of 1:0.5 to 1:1.5. As such, the distance P1 may be between about 0.5 to 1.5 times the width W1. In some embodiments, a ratio of a width W2 of a second active contact 242 to the distance P3 between adjacent active contacts of the second active contacts 242 is smaller than a ratio of a width W1 of a first active contact 222 to the distance P1 between adjacent active contacts of the first active contacts 222, for example, by up to a factor of 6. By arranging the distance P3 between the second active contacts 242 to be within the range described as above, cracks in the interlayer insulating layer 150 occurring between the second active contacts 242 may be prevented or reduced, and simultaneously, degradation in current characteristics of the second peripheral circuit device 230 due to reduction in the number of the second active contacts 242 may be significantly reduced.

Figure 5:
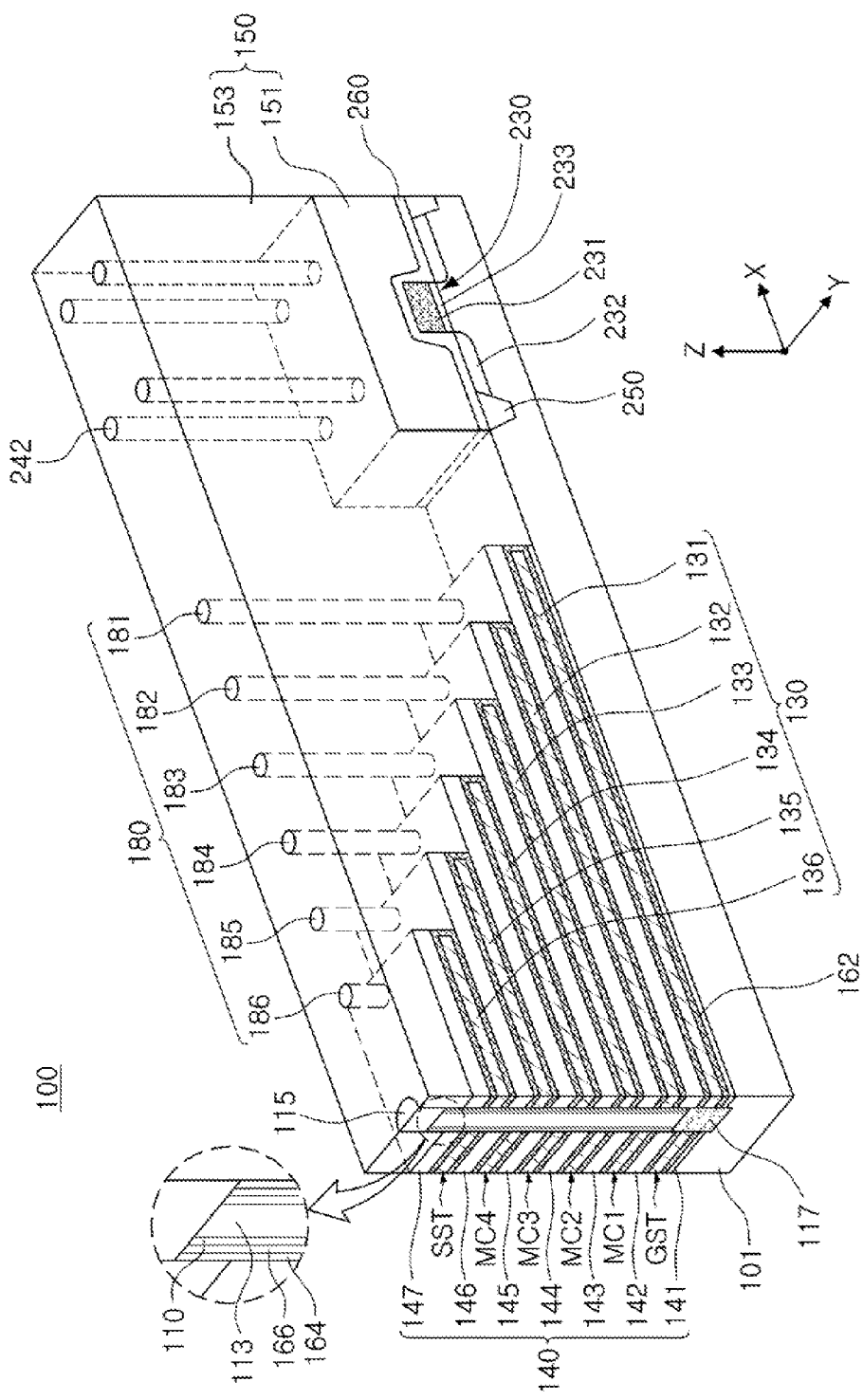
FIG. 5 is a perspective view of region A of a memory device illustrated in FIG. 3 according to certain exemplary embodiments of the present inventive concept.

FIG. 5 is a perspective view of region A of a memory device illustrated in FIG. 3.

With reference to FIG. 5, the memory device 100 may include a plurality of gate electrode layers 131 to 136 (gate electrode layers 130) alternately stacked on an upper surface of the substrate 101 in a Z-axis direction, and a plurality of insulating layers 141 to 147 (insulating layers 140). The plurality of gate electrode layers 130 and the plurality of insulating layers 140 may be extended lengthwise in a single direction, for example, in an X-axis direction of FIG. 5. The plurality of gate electrode layers 130 and the plurality of insulating layers 140 may be disposed adjacently to the channel layer 110 extending in a direction perpendicular to an upper surface of the substrate 101 in the cell region C.

The channel layer 110 may be disposed in a hollow shape having a circularly shaped cross sectional surface, and may have a hollow circular ring shape. The channel layer 110 may be formed, for example, of a semiconductor material, for example, a doped semiconductor material. A space formed in a central portion of the channel layer 110 may be filled with an embedded insulating layer 113, and a conductive layer 115 may be formed on the channel layer 110. The conductive layer 115 may be connected to a bit line to be provided as drain regions of a plurality of memory cell devices disposed in the cell region C.

Respective gate electrode layers 130 may form gate electrodes of a ground selection transistor GST, a plurality of memory cell transistors MC1 to MCn, and a string selection transistor SST. The gate electrode layers 130 may extend and form word lines WL1 to WLn, and may be commonly connected to memory cell strings adjacent to each other which are provided by a predetermined unit and are arranged in a first direction (x-axis direction) and a second direction (y-axis direction). In an exemplary embodiment, the total number of gate electrode layers 130 configuring the memory cell transistors MC1 to MCn may be $2^N$, where N is a natural number.

The gate electrode layer 131 of the ground selection transistor GST may be connected to the ground select line GSL. FIG. 5 illustrates one gate electrode layer 136 of the string selection transistor SST and one gate electrode layer 131 of the ground selection transistor GST, but exemplary embodiments of the present inventive concept are not limited to the number. In a different manner, the gate electrode layers 131 and 136 of the ground selection transistor GST and the string selection transistor SST may have a structure different from that of gate electrode layers 132 to 135 of the memory cell transistors MC1 to MCn.

The plurality of gate electrode layers 130 may include, for example, polycrystalline silicon, or a metal silicide material. The metal silicide material may be a silicide material of a metal selected from among, for example, cobalt (Co), nickel (Ni), hafnium (Hf), platinum (Pt), tungsten (W) and titanium (Ti). According to an exemplary embodiment, the plurality of gate electrode layers 130 may include, for example, tungsten (W). In addition, although not illustrated in the drawings, the plurality of gate electrode layers 130 may further include a diffusion barrier layer, and for example, the diffusion barrier layer may contain at least one of tungsten nitride (WN), tantalum nitride (TaN), and titanium nitride (TiN). The plurality of gate electrode layers 130 may be electrically connected to the plurality of cell contacts 181 to 186, respectively, in the pad region. The cell contacts 181 to 186, also referred to as plugs or pillars, may penetrate through portions of the interlayer insulating layer 150 and at least one of the plurality of insulating layers 140 to be connected to the gate electrode layers 130, respectively. The cell contacts may be formed of a conductive material, such as, for example, metal, polycrystalline silicon, or a metal silicide material.

The plurality of insulating layers 140 stacked alternately with the plurality of gate electrode layers 130 may be separated from each other by the isolation insulating layer 102 in a y-axis direction in a manner similar to the plurality of gate electrode layers 130. The plurality of insulating layers 140 may include an insulating material such as silicon oxide or silicon nitride.

A gate insulating layer 160 including a blocking layer 162, a charge storage layer 164, a tunneling layer 166, and the like may be disposed between the channel layer 110 and the gate electrode layers 130. All of the blocking layer 162, the charge storage layer 164, and the tunneling layer 166 may be disposed to encompass the gate electrode layer 130 according to a structure of the memory device 100. Alternatively, a portion of the gate insulating layer 160 may extend in a Z-axis direction to be parallel to the channel layer 110 to be disposed externally from the channel layer 110, and the remaining portion of the gate insulating layer 160 may be disposed to encompass the gate electrode layers 130. In the exemplary embodiment of the present inventive concept of FIG. 3, the charge storage layer 164 and the tunneling layer 166 may be disposed externally from the channel layer 110 to extend in a Z-axis direction so as to be parallel to the channel layer 110, and the blocking layer 162 may be disposed to encompass the gate electrode layers 130.

The blocking layer 162 may contain, for example, silicon oxide ($SiO_2$), silicon nitride ($Si_3N_4$), silicon oxynitride (SiON), or a high-k dielectric material. The high-K dielectric material may be any one of $Al_2O_3$, $Ta_2O_3$, $TiO_2$, $Y_2O_3$, $ZrO_2$, $ZrSi_xO_y$, $HfO_2$, $HfSi_xO_y$, $La_2O_3$, $LaAl_xO_y$, $LaHf_xO_y$, $HfAl_xO_y$, and $Pr_2O_3$. For example, when the blocking layer 162 contains a high-k dielectric material, the term 'high-k' may refer to a dielectric constant of the blocking layer 162 being higher than that of the tunneling layer 166 or higher than a dielectric constant of silicon oxide.

In a different manner, the blocking layer 162 may selectively include a plurality of layers having different dielectric constants. In this case, as a layer having a relatively low dielectric constant is disposed more adjacent to the channel layer 110 than a layer having a relatively high dielectric constant thereto, memory device characteristics, such as erase characteristics may be improved by controlling an energy band having a level equal to a barrier level.

The charge storage layer 164 may be a charge trapping layer or a floating gate conductive layer. For example, when the charge storage layer 164 is a floating gate, the charge storage layer 164 may be formed by depositing poly crystalline silicon using low pressure chemical vapor deposition (LPCVD). For example, when the charge storage layer 164 is a charge trapping layer, the charge storage layer 164 may contain at least one of $SiO_2$, $Si_3N_4$, SiON, $HfO_2$, $ZrO_2$, $Ta_2O_3$, $TiO_2$, $HfAl_xO_y$, $HfTa_xO_y$, $HfSi_xO_y$, $Al_xN_y$, and $AlGa_xN_y$.

The tunnel layer 166 may contain at least one of $SiO_2$, $Si_3N_4$, SiON, $HfO_2$, $HfSi_xO_y$, $Al_2O_3$, and $ZrO_2$.

The peripheral circuit device 230 may be arranged in the peripheral circuit region P. The peripheral circuit device 230 may include an active region 232 embedded in the substrate 101 and formed by implanting impurity into the substrate 101, a planar gate electrode layer 231 intersecting the active region 232, and a planar gate insulating layer 233 disposed between the planar gate electrode layer 231 and the substrate 101. The active region 232 may be provided as a source region or a drain region of the peripheral circuit device 230, and a device isolation layer 250 may be disposed externally from the active region 232. At least a portion of the active region 232 may also be shared by two or more peripheral circuit devices 230 adjacent to each other. The peripheral circuit device 230 or a plurality of adjacent devices may be formed of one or more transistors, for example, that are used for controlling operations of the memory cells of the cell region.

A cover layer 260 may be formed on the peripheral circuit device 230. The cover layer 260 may include a material having a predetermined etch selectivity with respect to the interlayer insulating layer 150. For example, when the interlayer insulating layer 150 includes a silicon oxide film, the cover layer 260 may include a silicon nitride film. The cover layer 260 may prevent the active region 232 from being excessively recessed in a process of forming the plurality of peripheral contacts 242. In a different manner, the cover layer 260 may also be selectively removed from a portion of the planar gate electrode layer 231. Thus, the gate contact, for example, the second gate contact 241 may be connected to the planar gate electrode layer 231 without contacting or passing through the cover layer 260.

A plurality of active contacts 242, also described as active region contacts 242, may be connected to a single active region 232. It should be noted that the active contacts 242 are termed as such because they contact active regions, and not because they form active regions themselves. A distance between adjacent active contacts of the plurality of active contacts 242 connected to a single active region 232 (e.g., connected at one side of planar gate electrode layer, or connected to a same source or drain region) may be determined depending on the size of the active region 232. In an exemplary embodiment, for example, when the active region 232 is larger than a predetermined reference size, the active contacts 242 may be formed to have a distance greater therebetween than a distance between the active contacts connected to the active region less than the reference size.

For example, in some embodiments, a semiconductor device includes at least two different-sized peripheral circuit devices. For example, a first peripheral circuit device may have a length in a first direction shorter than the length in the same direction of a second peripheral circuit device. If both peripheral circuit devices have a length below a threshold amount, then both may include a set of active contacts arranged in the length direction and that have the same distances between adjacent active contacts. However, if the first peripheral circuit has a length below the threshold amount and the second peripheral circuit has a length above the threshold amount, then the first peripheral circuit may include adjacent active contacts arranged in the length direction with a first distance between each contact, and the second peripheral circuit may include adjacent active contacts arranged in the length direction with a second distance between each contact. The second distance may be greater than the first distance. Cracks in the interlayer insulating layer 150 occurring between the active contacts may be prevented or reduced by forming the active contacts 242 according to such conditions.

The plurality of gate electrode layers 130 and insulating layers 140 may respectively extend by different lengths in an X-axis direction to form a plurality of step portions with other gate electrode layers 130 and insulating layers 140 stacked on different positions in a Z-axis direction. As the plurality of gate electrode layers 130 and insulating layers 140 extend by different lengths in the X-axis direction to have step portions, respectively, a plurality of pad regions may be provided. Although FIG. 5 illustrates that the insulating layer 140 is located on a position higher than that of the gate electrode layer 130 in the Z-axis direction in the respective pad region, in a manner different therefrom, the gate electrode layer 130 may be located to be higher than the insulating layer 140.

The memory device 100 according to certain exemplary embodiments may include an interlayer insulating layer 150 disposed on the substrate 101 in the cell region C and the peripheral circuit region P. The interlayer insulating layer 150 may include a first interlayer insulating layer 151 and a second interlayer insulating layer 153. In certain exemplary embodiments, the first and second interlayer insulating layers 151 and 153 may include the same material, such as silicon oxide, silicon nitride, or the like, or may include different materials. The first interlayer insulating layer 151 may only be disposed in the peripheral circuit region P to cover the peripheral circuit device 230. In detail, the first interlayer insulation layer 151 may only be disposed in a region in which the peripheral circuit devices 210 and 230 are provided. In some embodiments, the first interlayer insulating layer 151 may include an HDP oxide layer, and the second interlayer insulating layer 153 may include a TEOS oxide layer. The second interlayer insulating layer 153 may be formed, for example, using a process such as physical vapor deposition (PVD), chemical vapor deposition (CVD), sub-atmospheric chemical vapor deposition (SACVD), low pressure chemical vapor deposition (LP-CVD), plasma enhanced chemical vapor deposition (PECVD), or the like.

Figure 6:
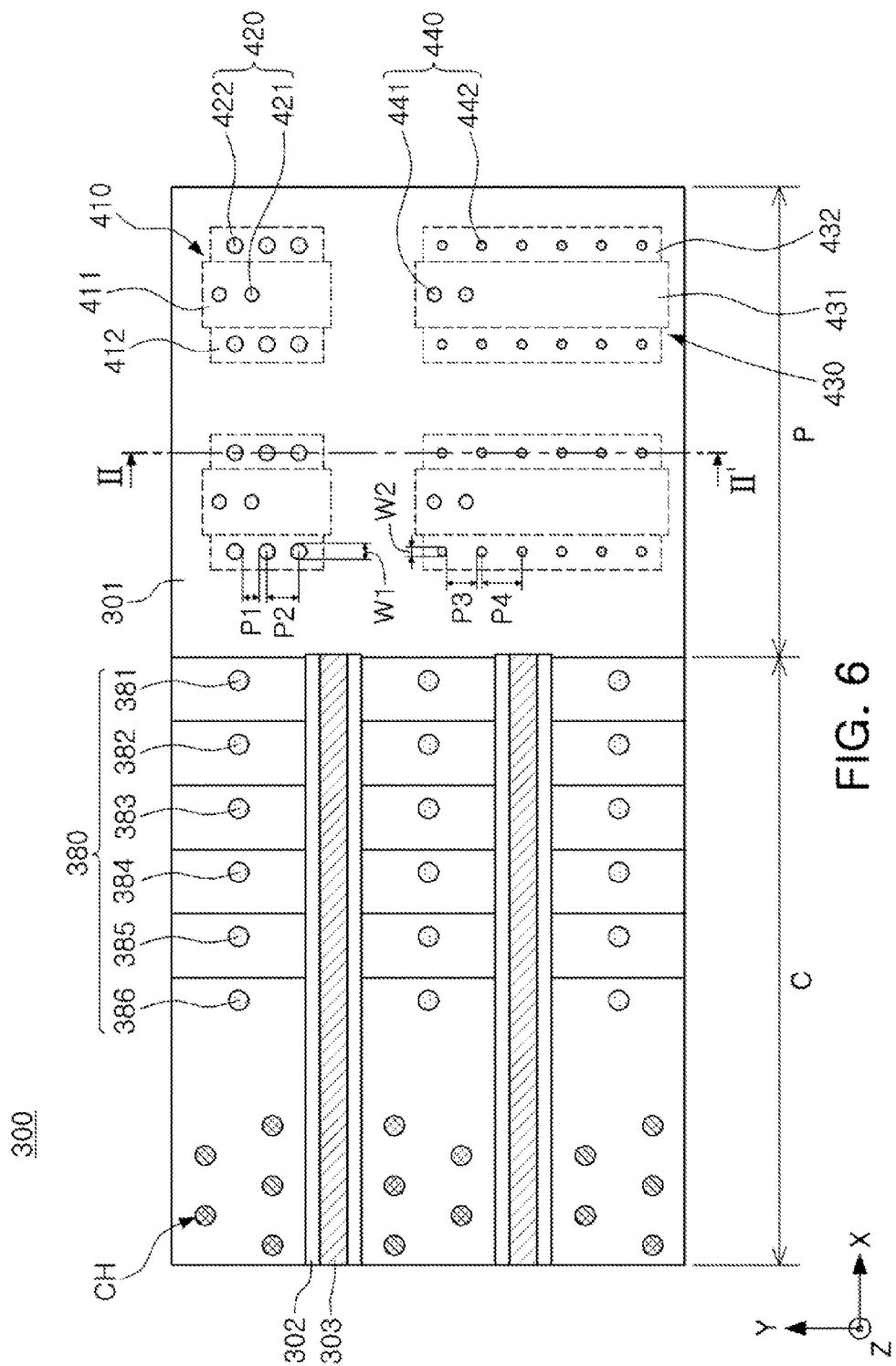
FIG. 6 is a plan view of a memory device according to certain exemplary embodiments of the present inventive concept.

FIG. 6 is a plan view of a memory device according to an exemplary embodiment of the present inventive concept.

With reference to FIG. 6, a memory device 300 according to an exemplary embodiment of the present inventive concept may include a cell region C and a peripheral circuit region P. The cell region C may include a plurality of gate electrode layers, channel regions CH, a plurality of cell contacts 381 to 386 (cell contacts 380) connected to the plurality of respective gate electrode layers, and the like. The plurality of gate electrode layers and the channel regions CH may be divided into a plurality of unit cell regions by an isolation insulating layer 302 and a common source line 303.

A plurality of peripheral circuit devices 410 and 430 may be disposed in the peripheral circuit region P. The plurality of peripheral circuit devices 410 and 430 may be, for example, planar transistors, and may include planar gate electrode layers 411 and 431 and active regions 412 and 432, and the like, respectively. A plurality of peripheral contacts 420 and 440 may be connected to the planar gate electrode layers 411 and 431 and the active regions 412 and 432 of the peripheral circuit devices 410 and 430, respectively.

The first active region 412 may have a size smaller than the second active region 432. A distance P3 between second active contacts 442 connected to the second active region 432 having a relatively large area may be greater than a distance P1 between first active contacts 422 connected to the first active region 412.

In detail, in the exemplary embodiment of FIG. 6, a width W2 of the second active contact 442 may be less than a width W1 of the first active contact 422 in a manner different from the exemplary embodiment discussed above with reference to FIG. 3 in which the widths of the first and second active contacts 222 and 242 are equal to each other. A distance P4 between centers of adjacent second active contacts of the second active contacts 442 and a distance P2 between centers of adjacent first active contacts of the first active contacts 422 (e.g., pitches between adjacent active contacts) may be substantially equal to each other.

Figure 7:
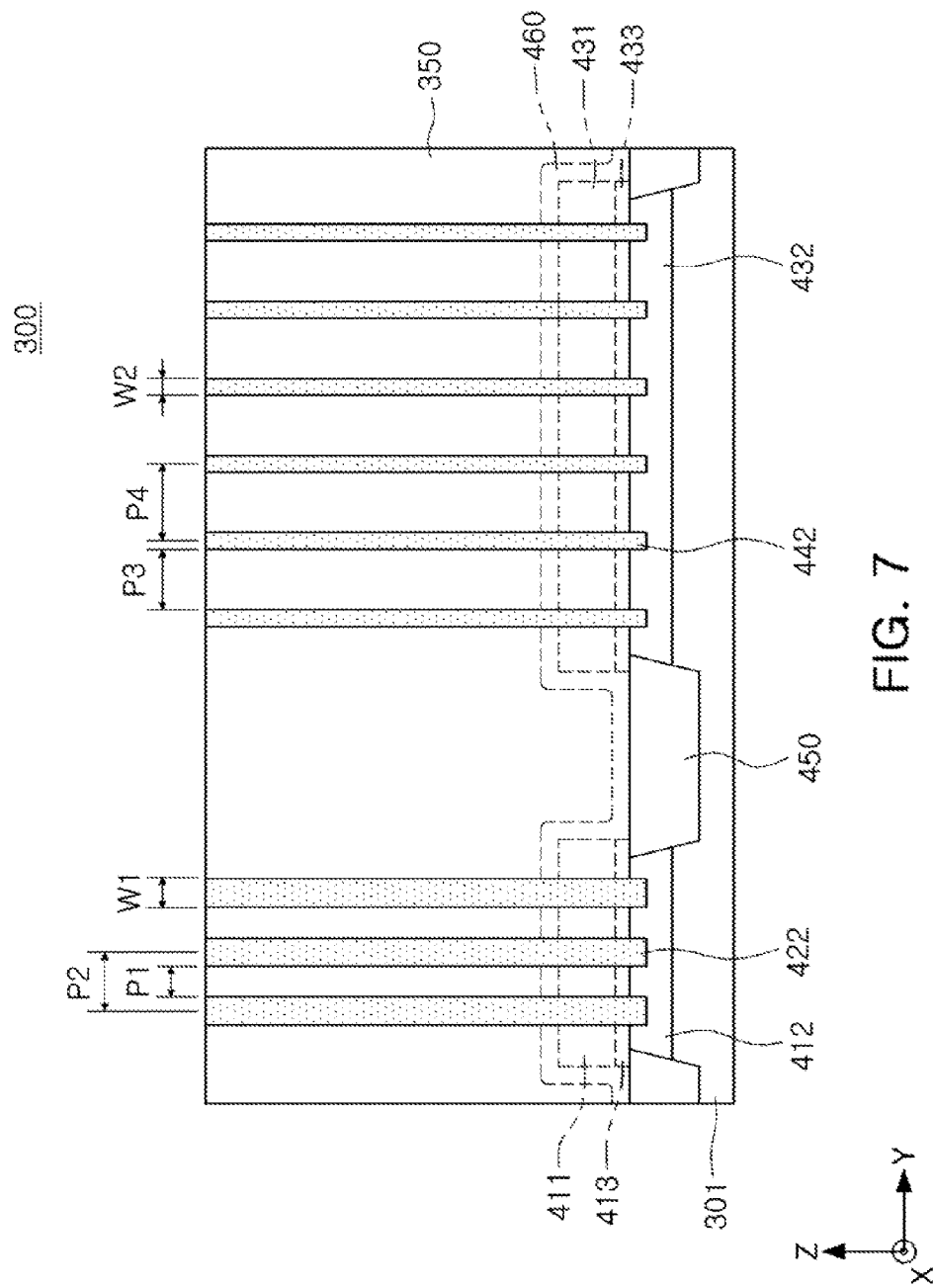
FIG. 7 is a cross-sectional view of a memory device taken along line II-II' of FIG. 6 according to certain exemplary embodiments of the present inventive concept.

FIG. 7 is a cross-sectional view of the memory device taken along line II-II' of FIG. 6.

With reference to FIG. 7, the memory device 300 according to certain exemplary embodiments may include a substrate 301 and peripheral circuit devices 410 and 430 formed on the substrate 301. The peripheral circuit devices 410 and 430 may include the active regions 412 and 432, the planar gate electrode layers 411 and 431, and planar gate insulating layers 413 and 433, and the like, respectively. A device isolation layer 450 may be disposed externally from the active regions 412 and 432. An interlayer insulating layer 450 including silicon oxide, silicon nitride, or the like may be formed on the peripheral circuit devices 410 and 430, respectively.

In the case of the first active contact 422 connected to the first active region 412 having a relatively small area, a ratio of the width W1 of the first active contact 422 to the distance P1 between the first active contacts 422 may be within a range of 1:0.5 to 1:1.5. In a different manner, in the case of the second active contact 442 connected to the second active region 432 having a relatively large area, a ratio of the width W2 of the second active contact 442 to the distance P3 between the second active contacts 442 may be within a range of 1:1.5 to 1:3. For instance, the distance P3 between the second active contacts 442 may be greater than the distance P1 between the first active contacts 422.

In a manner different from the exemplary embodiment with reference to FIGS. 3 and 4, in the exemplary embodiment of FIG. 7, the widths of the first active contact 422 and the second active contact 442 may be different from each other. For example, the width W2 of the second active contact 442 may be less than the width W1 of the first active contact 422. In a different manner, the distance P4 between centers of the second active contacts 442 may be substantially the same as the distance P2 between centers of the first active contacts 422. In comparing the exemplary embodiment of FIG. 7 with the exemplary embodiment of FIG. 4, by relatively increasing the number of the second active contacts 442 rather than reducing the width W2 of the second active contacts 442, current characteristics of the second peripheral circuit device 430 may be secured. The number of the second active contacts can be increased according to decrease of the width W2, and deterioration of the current characteristic of the second peripheral circuit device 430 may be prevented.

As can be seen in the different embodiments discussed above, in certain embodiments, each peripheral device may form a transistor in the peripheral region of a memory device. Each peripheral device may include, for example, a gate, and source/drain regions on either side of the gate. Each source/drain region may be an active region, and may have a particular number of vertical contacts extending vertically from the substrate where the source/drain region is formed to a vertical level above a top of a stack of stacked gate and insulating layers of a vertical stacked memory device, such as vertical NAND. Each source/drain region may include a plurality of vertical contacts, which may form a row of contacts. For example, the row of contacts may be arranged in a line. In some embodiments, a source/drain region at one side of the gate may include the same number of vertical contacts as the source/drain region at the opposite side of the gate. These contacts in one row may be spaced the same distance apart from each other as the contacts in the opposite row. These contacts may also have the same width, or diameter, as the contacts in the opposite row.

However, in some embodiments, for two different peripheral devices, each having symmetric rows of contacts on either side of a gate layer, the spacing between vertical contacts in a row of a first peripheral device is different from a spacing between vertical contacts in a row of the second peripheral device. For example, distances between adjacent vertical contacts in a row of source/drain contacts of a first device may be greater than distances between adjacent vertical contacts in a row of source/drain contacts of the second device. In some embodiments, the distances between adjacent vertical contacts in a row of source/drain contacts of one device depends on the device's size, where devices having a greater length along the rows, and/or a greater area, have greater distances between adjacent vertical contacts in a row of vertical contacts.

FIGS. 8 to 23 are drawings illustrating a method of manufacturing a semiconductor device such as illustrated in FIGS. 3 to 5, according to certain exemplary embodiments.

Figure 8:
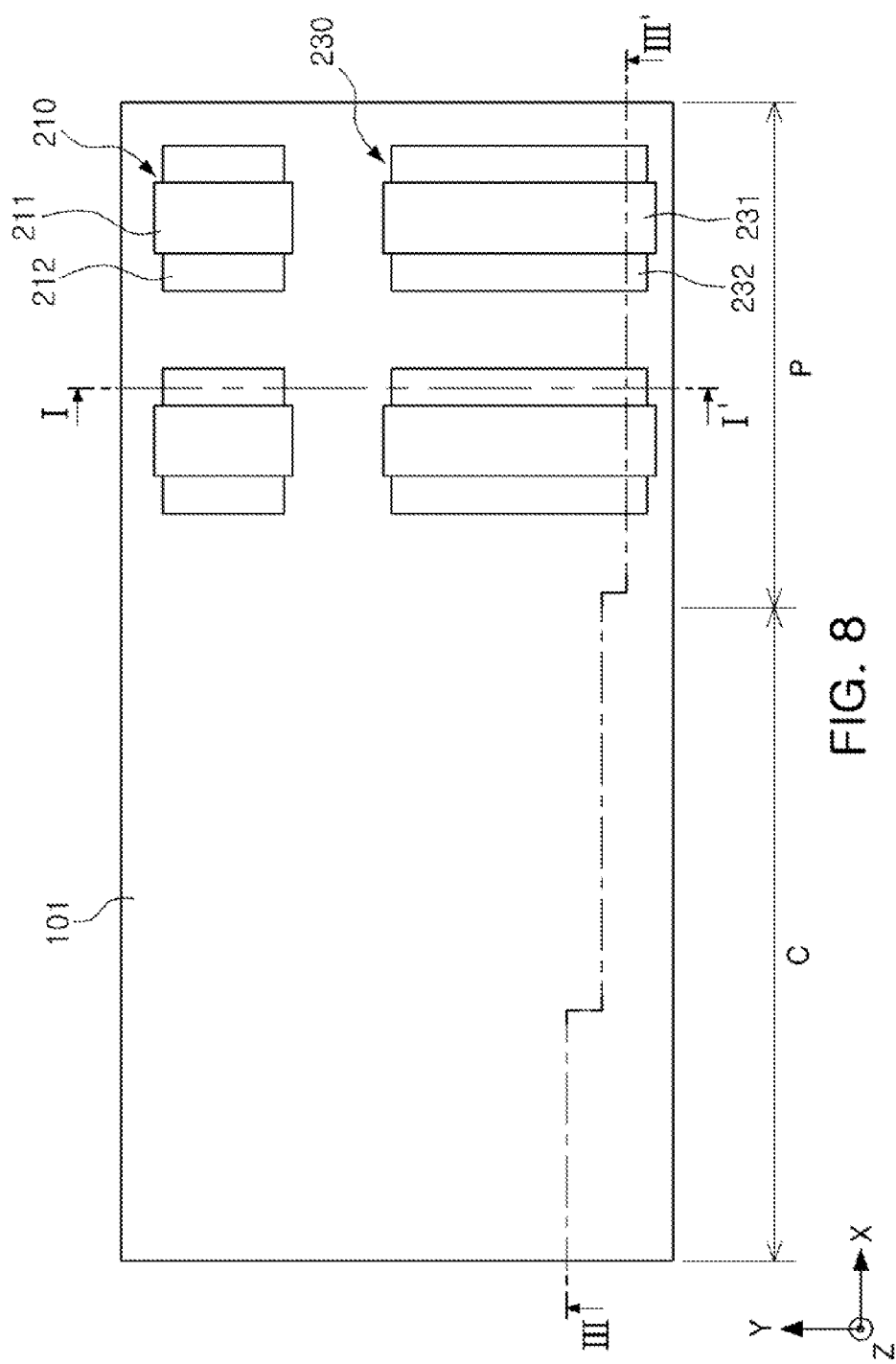

First, referring to FIG. 8, in a method of manufacturing a memory device according to an exemplary embodiment of the present inventive concept, peripheral circuit devices 210 and 230 may be formed on a substrate 101. The peripheral circuit devices 210 and 230 may be formed in a peripheral circuit region P. The peripheral circuit region P may be described as a region adjacent to a cell region C in which memory cells are disposed. The peripheral circuit region P may include peripheral circuit devices that are used for controlling memory access operations (e.g., read, write, erase) for the memory cells.

The peripheral circuit devices 210 and 230 may include a planar transistor, and the peripheral circuit devices 210 and 230 may include active regions 212 and 232, planar gate electrode layers 211 and 231, and the like, respectively. The active regions 212 and 232 may include regions formed by implanting impurity by an ion implantation process or the like, and include source and drain regions of the peripheral circuit devices 210 and 230, respectively. In some embodiments, an active region includes a source, drain, and channel region between the source and drain. However, as used herein, the term "active region" may be used to specifically refer to one of these sub-regions (e.g., a source, or drain, for example). The planar gate electrode layers 211 and 231 may include a conductive material of a metal, polycrystalline silicon, or the like, and may intersect the active regions 212 and 232.

The peripheral circuit devices 210 and 230 may include a first peripheral circuit device 210 and a second peripheral circuit device 230 having different sizes. The first peripheral circuit device 210 may be smaller than the second peripheral circuit device 230, and the first active region 212 may have an area less than that of the second active region 232.

FIG. 9 is a cross-sectional view of FIG. 8 taken along line I-I', and FIG. 10 is a cross-sectional view taken along line III-III' of FIG. 8. With reference to FIGS. 9 and 10, the device isolation layer 250 and the active regions 212 and 232 may be arranged on the substrate 101. The device isolation layer 250 may be a region for electrical separation of the peripheral circuit devices 210 and 230. The planar gate electrode layers 211 and 231 may be arranged to intersect the active regions 212 and 232 on the substrate 101, respectively, and the planar gate insulating layers 213 and 233 may be provided between the planar gate electrode layers 211 and 231 and the substrate 101, respectively. The first active region 212 may have an area less than that of the second active region 232.

Figure 11:
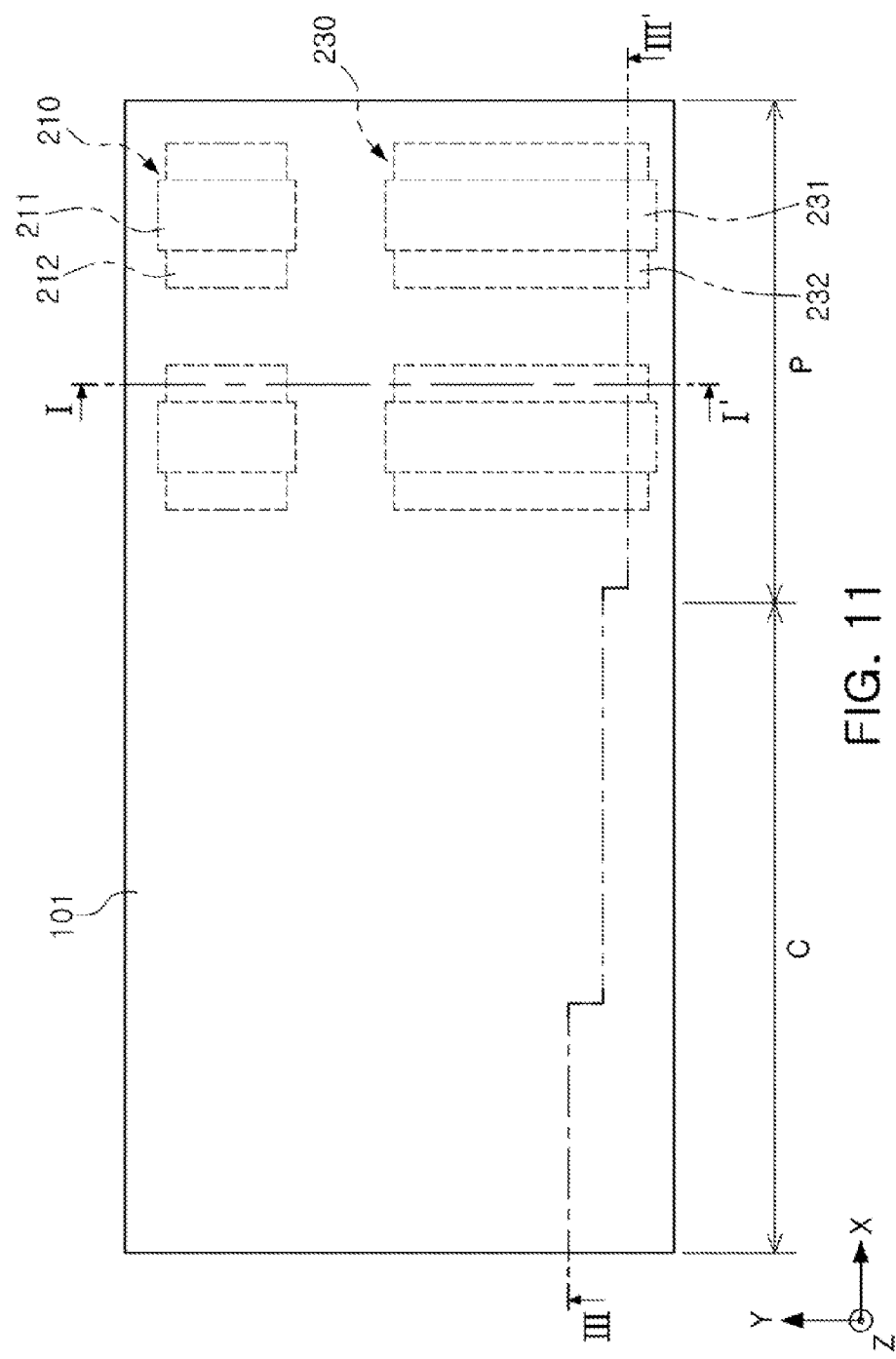

Next, with reference to FIG. 11, the first interlayer insulating layer 151 may be formed on the peripheral circuit devices 210 and 230 in the peripheral circuit region P. The first interlayer insulating layer 151 may contain, for example, silicon oxide or silicon nitride, and may fill a space defined by an upper surface of the substrate 101, the planar gate electrode layers 211 and 231 of the peripheral circuit devices 210 and 230, and the like. According to an exemplary embodiment of the present inventive concept, the first interlayer insulating layer 151 may include an HDP oxide layer having excellent gap filling characteristics.

Figure 12:
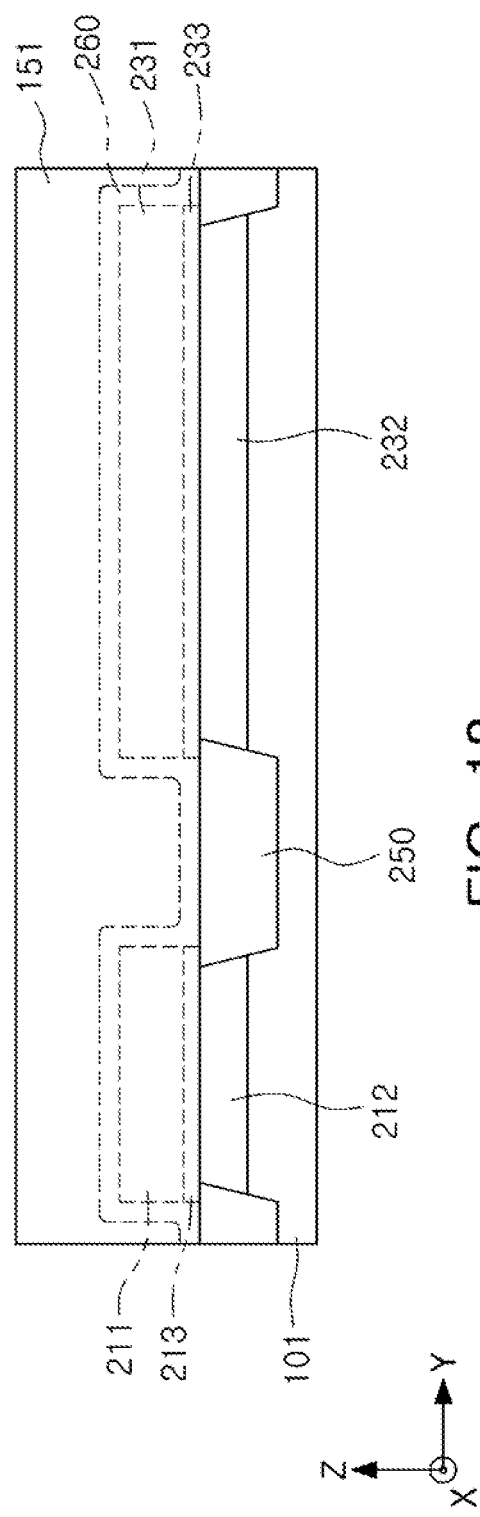

With reference to FIG. 12 illustrating a cross section taken along line I-I' of FIG. 11, the cover layer 260 may be formed on the peripheral circuit devices 210 and 230. The cover layer 260 may be formed using a material having a predetermined etching selectivity with the first interlayer insulating layer 151. According to an exemplary embodiment of the present inventive concept, the first interlayer insulating layer 151 may contain silicon oxide, and the cover layer 260 may contain silicon nitride. The cover layer 260 may prevent the planar gate electrode layers 211 and 231 and the active regions 212 and 232 from being excessively recessed in a process of forming a plurality of contacts connected to the planar gate electrode layers 211 and 231 and the active regions 212 and 232. In some embodiments of the present inventive concept, the cover layer 260 may only be formed on the active regions 212 and 232, while being removed from upper surfaces of the planar gate electrode layers 211 and 231 so as not to be present thereon, respectively.

Figure 13:
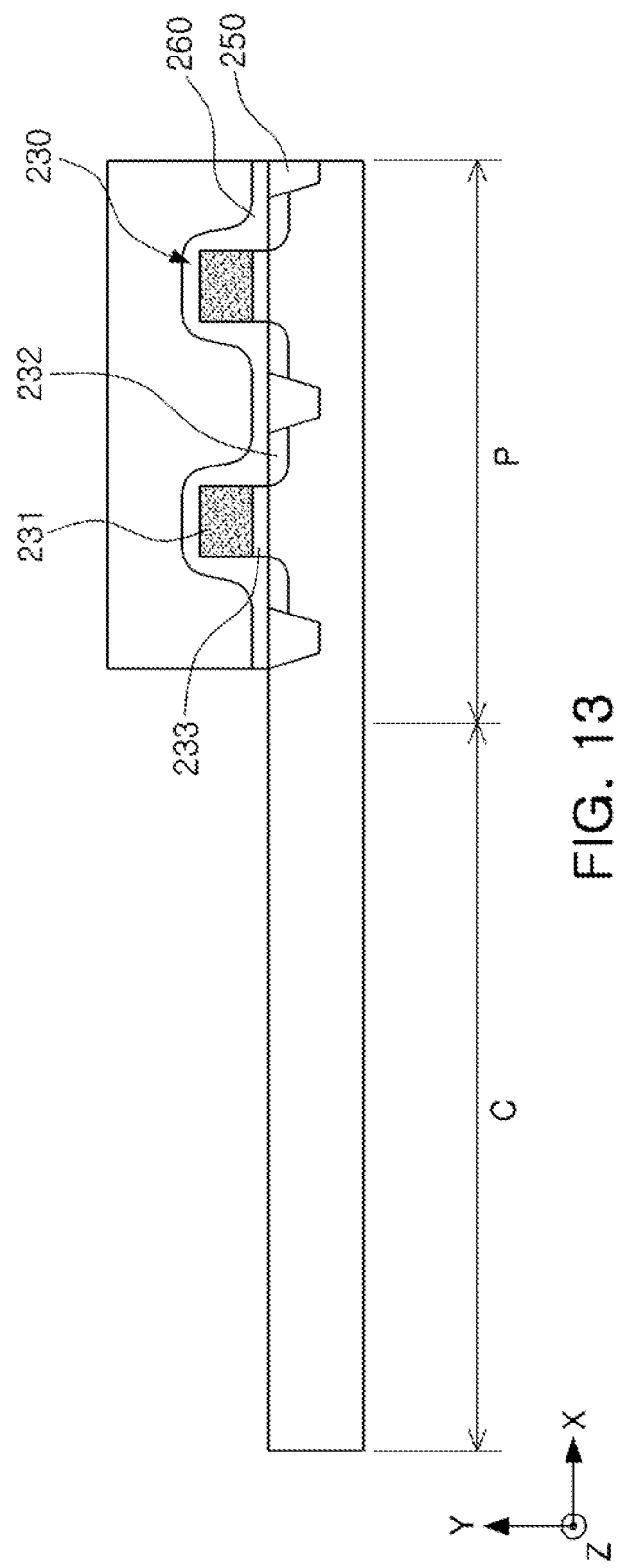

With reference to FIG. 13 illustrating a cross section taken along line III-III' of FIG. 11, the cover layer 260 and the first interlayer insulating layer 151 may only be formed in the peripheral circuit region P. In the process of manufacturing a memory device, the cover layer 260 and the first interlayer insulating layer 151 may be sequentially formed on the substrate 101, and then, the cover layer 260 and the first interlayer insulating layer 151 may be removed from only the cell region C to expose an upper surface of the substrate 101. A plurality of sacrificial layers and a plurality of insulating layers may be alternately stacked on the exposed upper surface of the substrate 101 in the cell region C. The plurality of sacrificial layers and insulating layers may have step portions formed through a plurality of etching processes. Hereinafter, the process will be described below with reference to FIG. 14.

Figure 14:
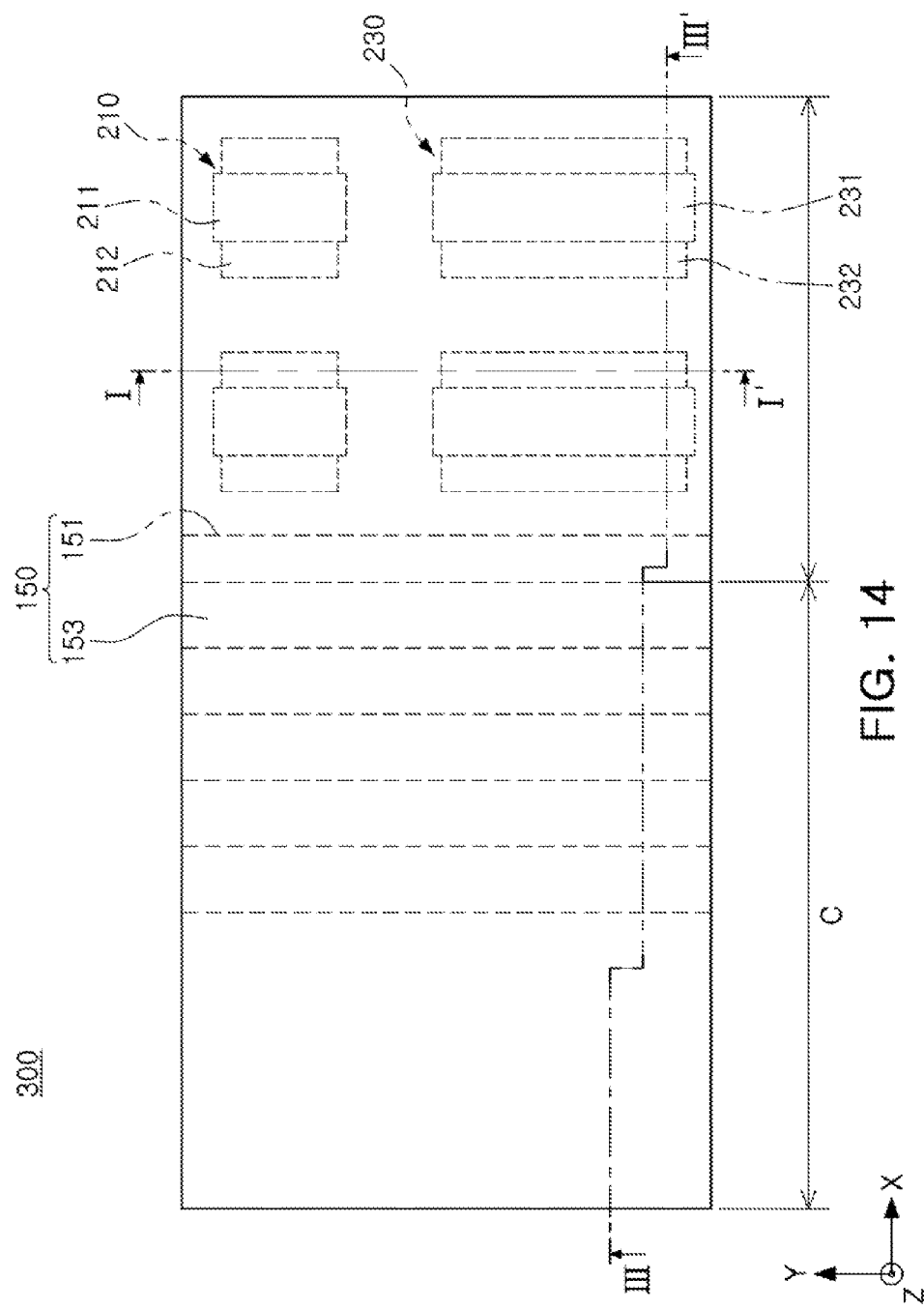

With reference to FIG. 14, the plurality of sacrificial layers and the plurality of insulating layers having a stepped structure may be formed in the cell region C. The plurality of sacrificial layers and the plurality of insulating layers may be alternately stacked. The plurality of sacrificial layers and the plurality of insulating layers are formed, and a second interlayer insulating layer 153 may be formed in the both of cell region C and peripheral circuit region P. The second interlayer insulating layer 153 may include the same or different material as that of the first interlayer insulating layer 151, and may have a volume greater than the first interlayer insulating layer 151. For example, the second interlayer insulating layer 153 may include a TEOS oxide layer of which a deposition speed is relatively fast.

Figure 15:
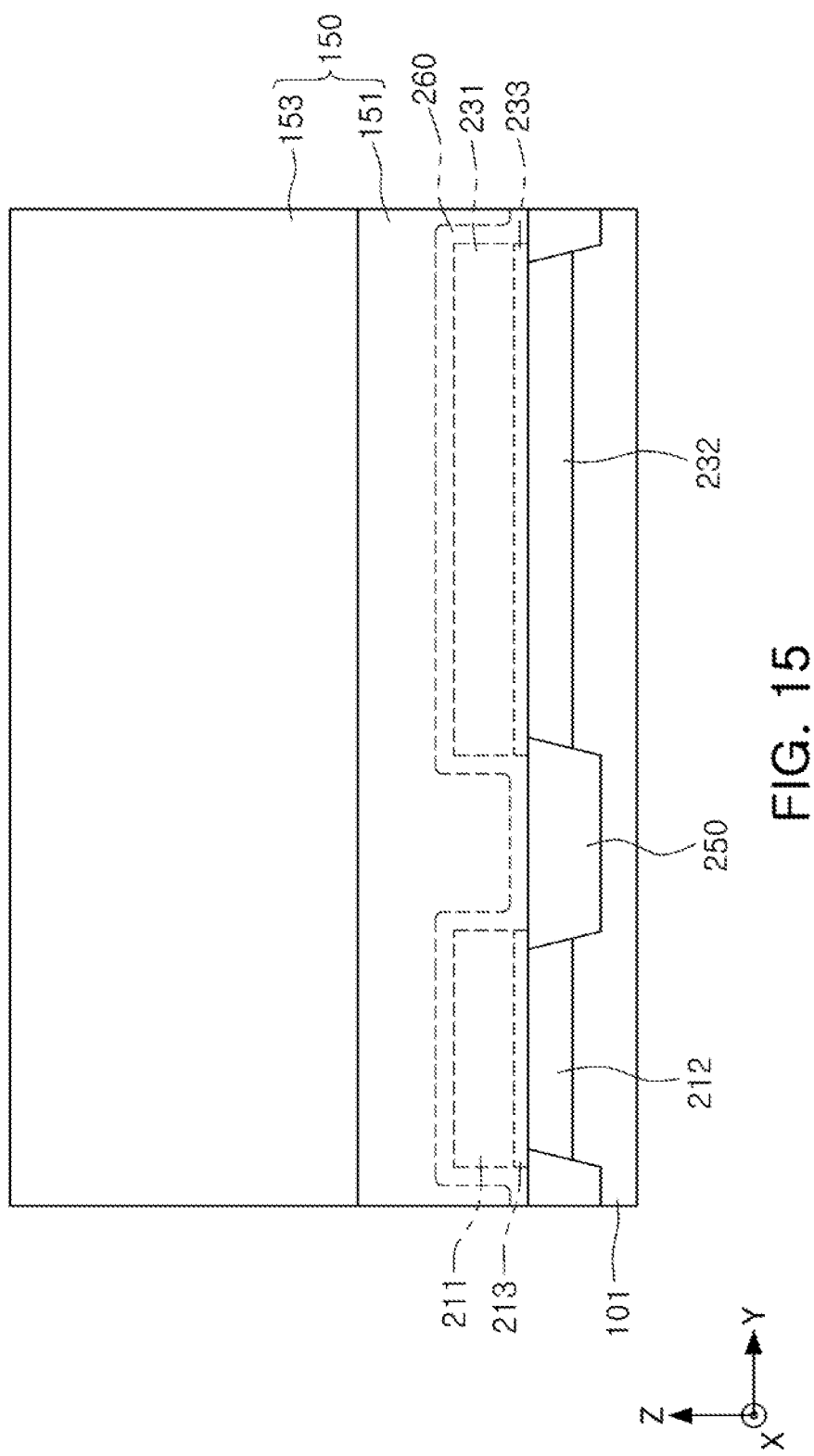
Figure 16:
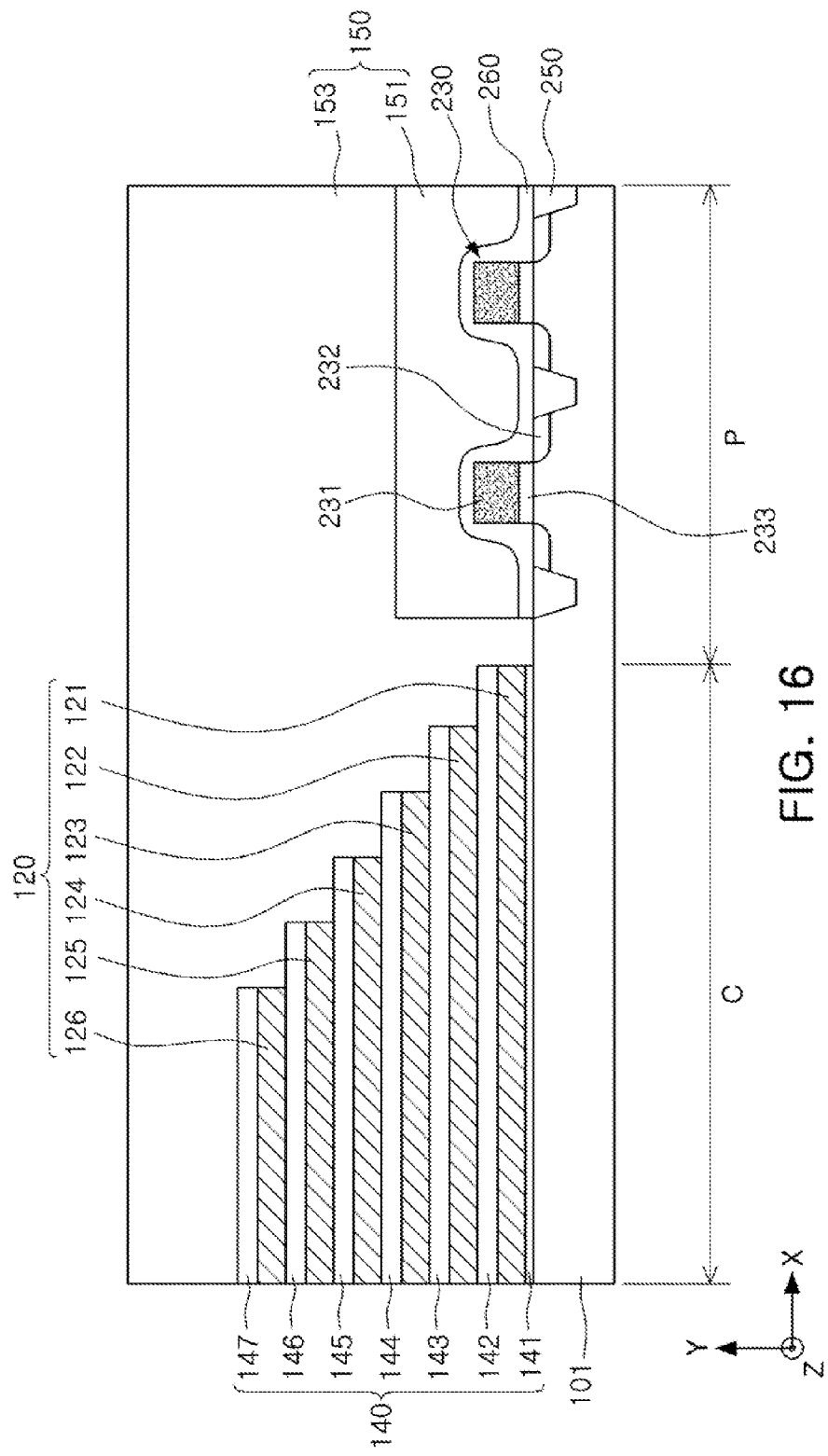

Referring to FIG. 15 illustrating a cross section taken along line I-I' of FIG. 14 and FIG. 16 illustrating a cross section taken along line III-III' of FIG. 14, the second interlayer insulating layer 153 may be disposed on the first interlayer insulating layer 151. The second interlayer insulating layer 153 may be disposed on the plurality of sacrificial layers 121 to 126 (sacrificial layers 120) and the plurality of insulating layers 141 to 147 (insulating layers 140) in the cell region C.

In order to form step portions between the sacrificial layers 120 and the insulating layers 140 adjacent to one another in a Z-axis direction as illustrated in FIG. 16, a predetermined mask layer may be formed on the plurality of sacrificial layers 120 and insulating layers 140 stacked alternately with each other on the substrate 101, and portions of the sacrificial layers 120 and the insulating layers 140 exposed by the mask layer may be etched. The sacrificial layers 120 and the insulating layers 140 may be sequentially etched by performing a process of etching the sacrificial layers 120 and the insulating layers 140 exposed by the mask layer in a plurality of numbers while trimming the mask layer, and thus a stepped structure having step portions may be formed.

In an exemplary embodiment of the present inventive concept, a respective insulating layer 140 and a respective sacrificial layer 120 may be provided as a pair, and the insulating layers 140 and the sacrificial layers 120 included in a plurality of pairs may extend by the same length in a single direction, for example, in an X-axis direction of FIG. 15. In some exemplary embodiment, the insulating layers 141 and 142 extending by the same length may be disposed on and below a lowermost sacrificial layer 121 in the Z-axis direction. In this case, the lowermost insulating layer 141 in the Z-axis direction may have a relatively thin thickness as compared to those of other insulating layers 142 to 147.

The plurality of sacrificial layers 120 may contain a material capable of being selectively etched with relatively high etch selectivity with the plurality of insulating layers 140. Such etch selectivity may be quantitatively represented via an etching speed ratio of the sacrificial layers 120 with respect to an etching speed of the insulating layers 140. For instance, the insulating layer 140 may be at least one of a silicon oxide layer and a silicon nitride layer, and the sacrificial layer 120 may be a layer selected from a silicon layer, a silicon oxide layer, a silicon carbide layer, and a silicon nitride layer, and for example, may be formed using a material different from that of the insulating layer 140. For example, when the insulating layer 140 is a silicon oxide layer, the sacrificial layer 120 may be a silicon nitride layer.

Figure 17:
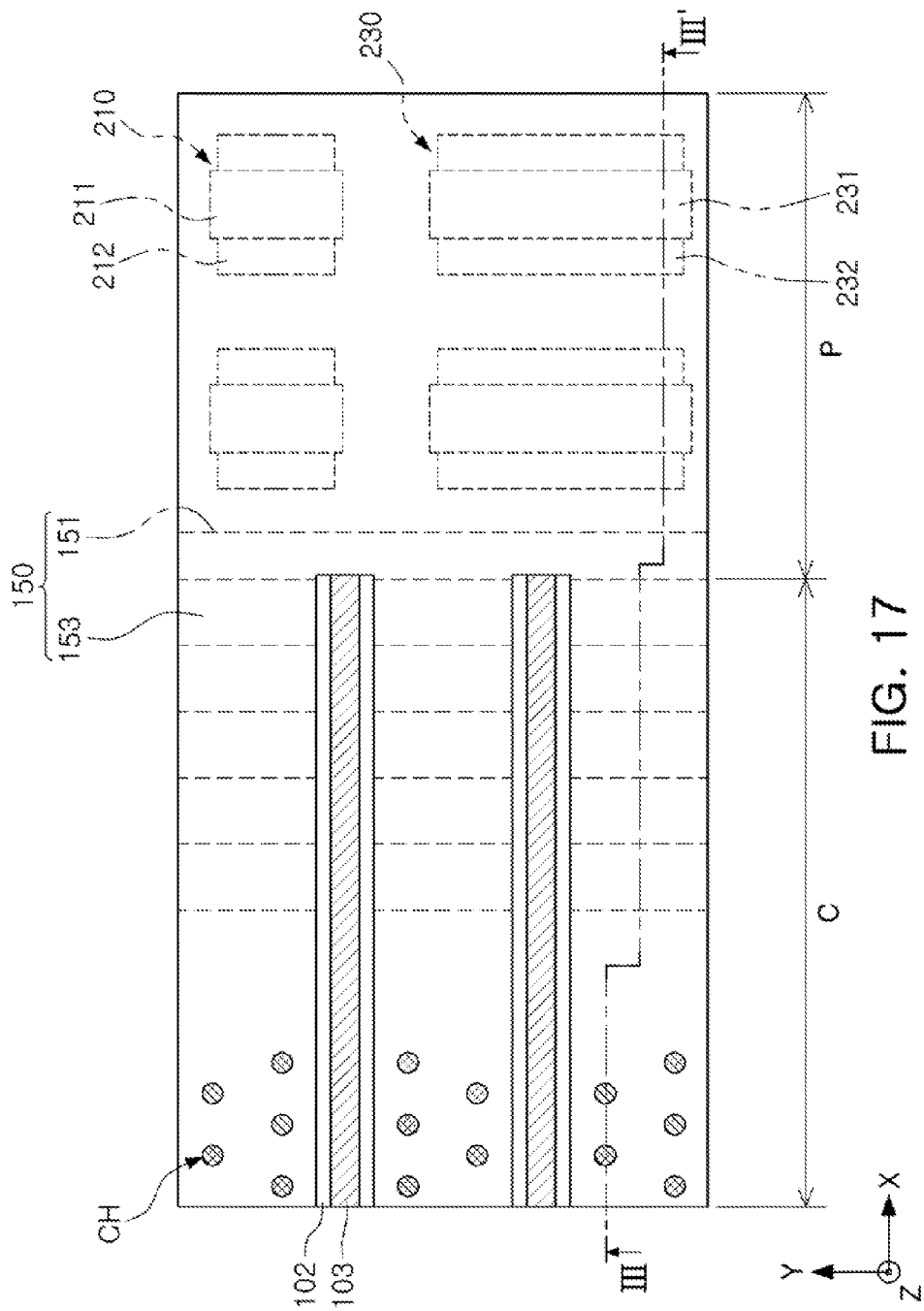

Subsequently, with reference to FIG. 17, a channel region CH, an isolation insulating layer 102, and a common source line 103 may be formed. In order to form the channel region CH, a channel opening portion may extend from an upper surface of the second interlayer insulating layer 153 to an upper surface of the substrate 101. A channel layer 110, an embedded insulating layer 113, a conductive layer 115, and the like may be formed in the channel opening portion. The channel layer 110 may have a form recessed from an upper surface of the substrate 101 to penetrate through a portion of the substrate. In another exemplary embodiment, an epitaxial layer formed through selective epitaxial growth may further be disposed between the channel layer 110 and the substrate 101. The structure and form of the channel region CH may be described in detail with reference to FIG. 18 illustrating a cross section taken along line III-III' of FIG. 17.

Figure 18:
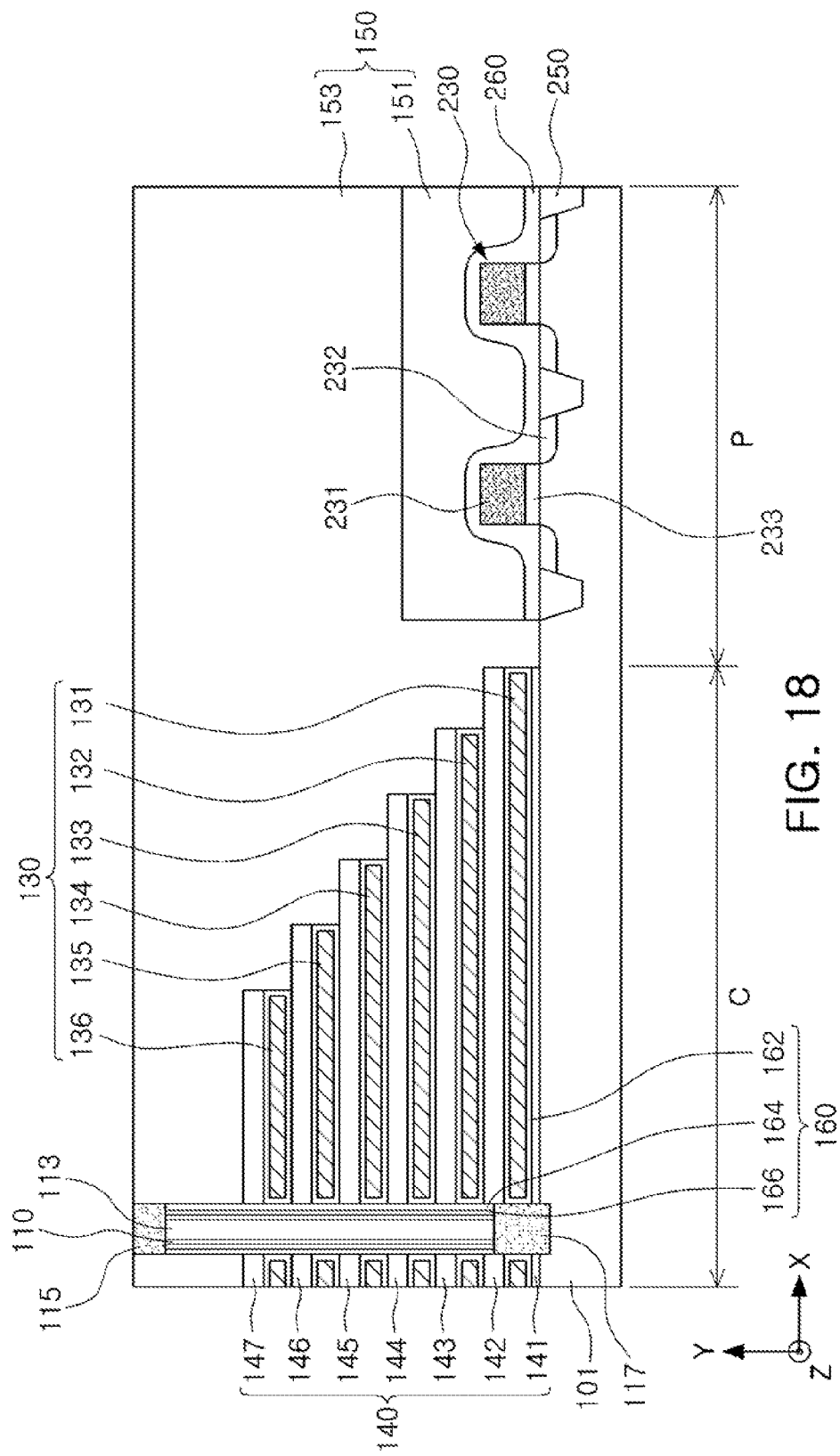

With reference to FIG. 18, the channel region CH may include a channel layer 110, an embedded insulating layer 113, a conductive layer 115, an epitaxial layer 117, and the like. The epitaxial layer 117 may be formed by applying a selective epitaxial growth process to an upper surface of the substrate 101 exposed by the channel opening portion for the formation of the channel region CH. The epitaxial layer 117 may extend to a height thereof adjacent to the gate electrode layer 131 of the ground selection transistor GST located at a lowermost position.

In certain embodiments, at least a portion of the gate insulating layers, for example, a charge storage layer 164 and a tunneling layer 166, may be formed externally from the channel layer 110. The charge storage layer 164 and the tunneling layer 166 may be formed by a process such as atomic layer deposition (ALD), chemical vapor deposition (CVD), or the like. The charge storage layer 164 and the tunneling layer 166 may be stacked sequentially from a region adjacent to the plurality of sacrificial layers 120 and insulating layers 140. The channel layer 110 may have a preset thickness, for example, a thickness within a range of ⅟₅₀ to ⅕ of a width of the channel opening portion, and may be formed by ALD or CVD in a manner similar to the charge storage layer 164 and the tunneling layer 166.

An internal space of the channel layer 110 may be filled with the embedded insulating layer 113. In one embodiment, selectively, before forming the embedded insulating layer 113, a hydrogen annealing process in which a structure having the channel layer 110 formed therein is subjected to heat treatment in a gas atmosphere including hydrogen or heavy hydrogen may further be performed. The majority of crystalline defects present in the channel layer 110 may be prevented by the hydrogen annealing process. Next, the conductive layer 115 may be formed on the channel layer 110 using a conductive material such as poly crystalline silicon or the like. The conductive layer 115 may be connected to a bit line to be provided as a drain region of a memory cell device. The vertical structure formed by at least the channel layer 110 may be referred to as a channel structure, or a channel pillar.

An opening portion for the formation of the isolation insulating layer 102 and the common source line 103 may be arranged after the channel region CH is formed. The plurality of sacrificial layers 120 and insulating layers 140 may be divided into a plurality of regions by the opening portion, and the plurality of sacrificial layers 120 may be selectively removed through the opening portion. A plurality of gate electrode layers 131 to 136 (gate electrode layers 130) may be formed in the portion from which the plurality of sacrificial layers 120 have been removed using a conductive material such as poly crystalline silicon or the like.

The metal silicide material may be a silicide material of a metal selected from among, for example, cobalt (Co), nickel (Ni), hafnium (Hf), platinum (Pt), tungsten (W) and titanium (Ti), or may be a combination thereof. For example, when the gate electrode layer 130 is formed of a metal silicide material, a silicidizing process may be performed by forming a separate metal layer after embedding silicon (Si) in a side of the opening portion, thereby forming the gate electrode layers 130. Before forming the plurality of gate electrode layers 130, the blocking layer 162 may first be formed in a space from which the plurality of sacrificial layers 120 have been removed. After the plurality of gate electrode layers 130 are formed, the isolation insulating layer 102 and the common source line 103 may be formed.

Figure 19:
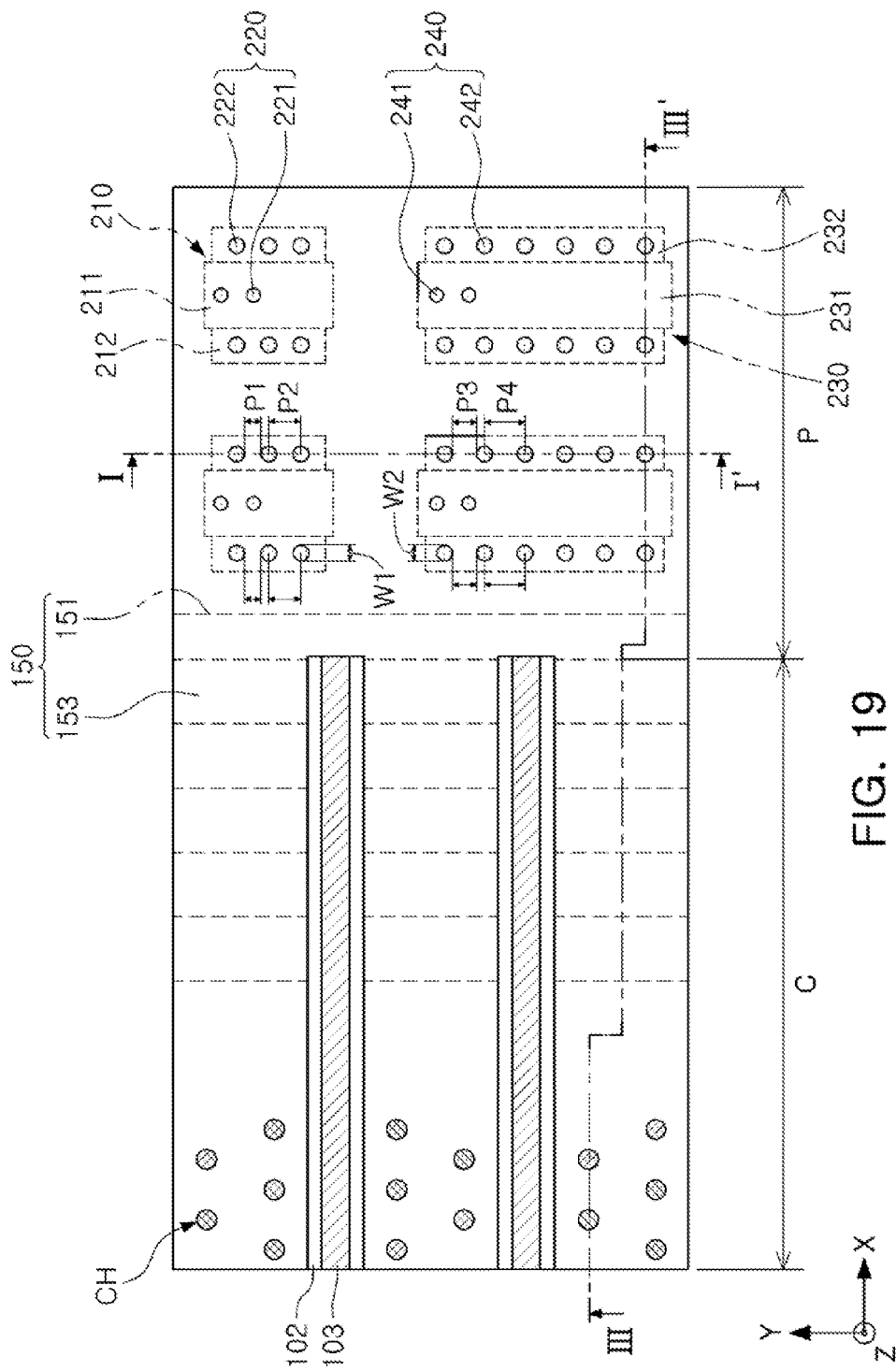

Then, referring to FIG. 19, a plurality of peripheral contacts 220 and 240 connected to the plurality of peripheral circuit devices 210 and 230 may be formed. The plurality of peripheral contacts 220 and 240 may include a plurality of gate contacts 221 and 241 connected to the planar gate electrode layers 211 and 231, and a plurality of active contacts 222 and 242 connected to the active regions 212 and 232, respectively.

As described above, the first peripheral circuit device 210 may be of a size less than the second peripheral circuit device 230, and the first active region 212 may also be smaller than the second active region 232. A distance P1 between active contacts of the plurality of first active contacts 222 connected to the first active region 212 may be less than that of the distance P3 between active contacts of the plurality of second active contacts 242 connected to the second active region 232. The width W1 of the first active contacts 222 may be substantially equal to the width W2 of the second active contacts 242. In some embodiments, however, the width W2 of the second active contact 242 may be greater than the width W1 of the first active contact 222 within a process condition.

For example, if the distance between second active contacts and the distance between first active contacts are equal to each other, the number of the second active contacts connected to a single second active region may be increased. In this case, due to stress and the like occurring during an operation of forming the second active contacts, cracks may occur in a portion of an interlayer insulating layer located between the second active contacts. In order to prevent the occurrence of cracks as above, in an exemplary embodiment of the present inventive concept, the second active contacts 242 may be formed in such a manner that the distance P3 between adjacent second active contacts 242 may be greater than that of the distance P1 between adjacent first active contacts 222.

Figure 20:
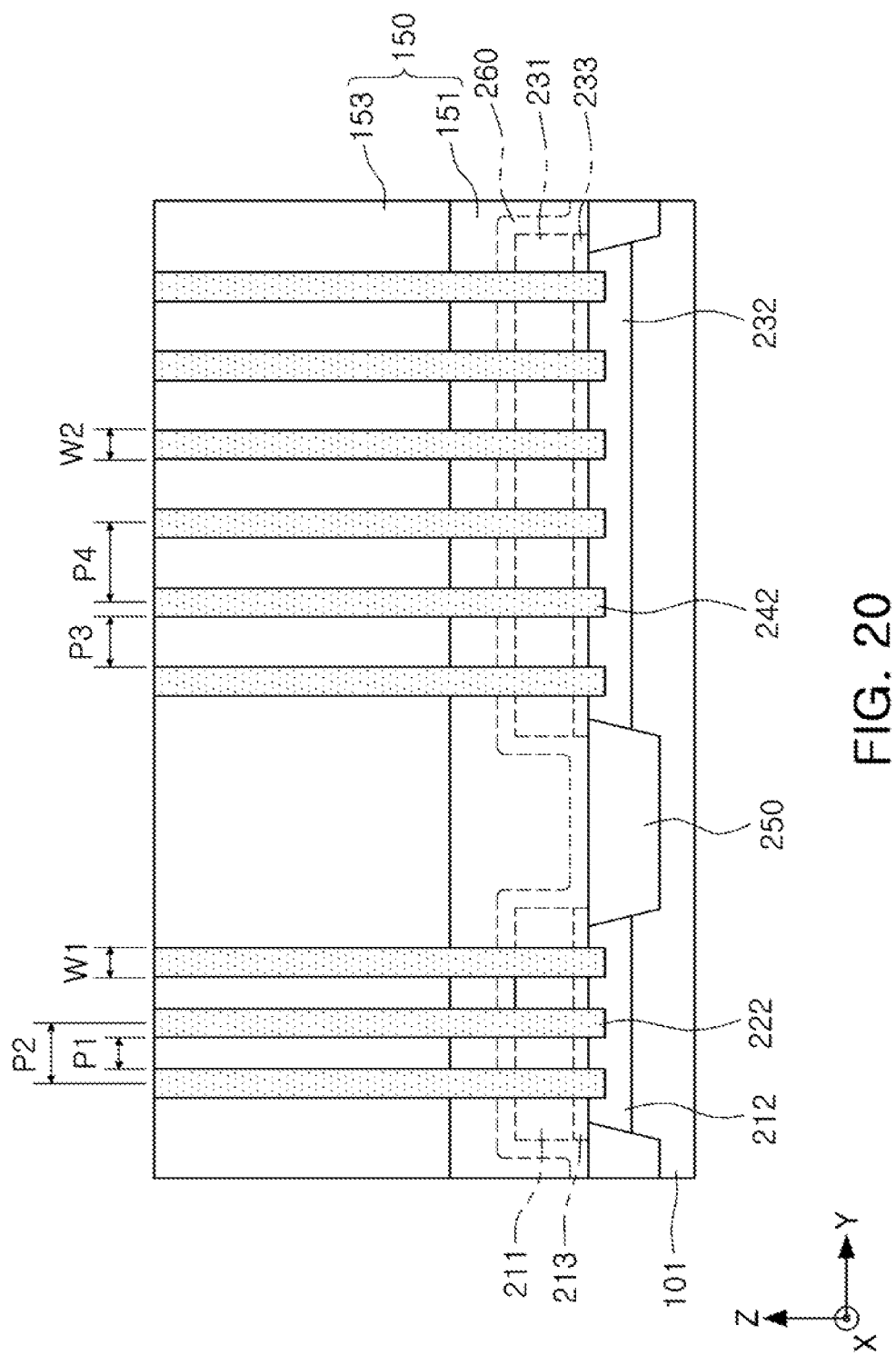
Figure 21:
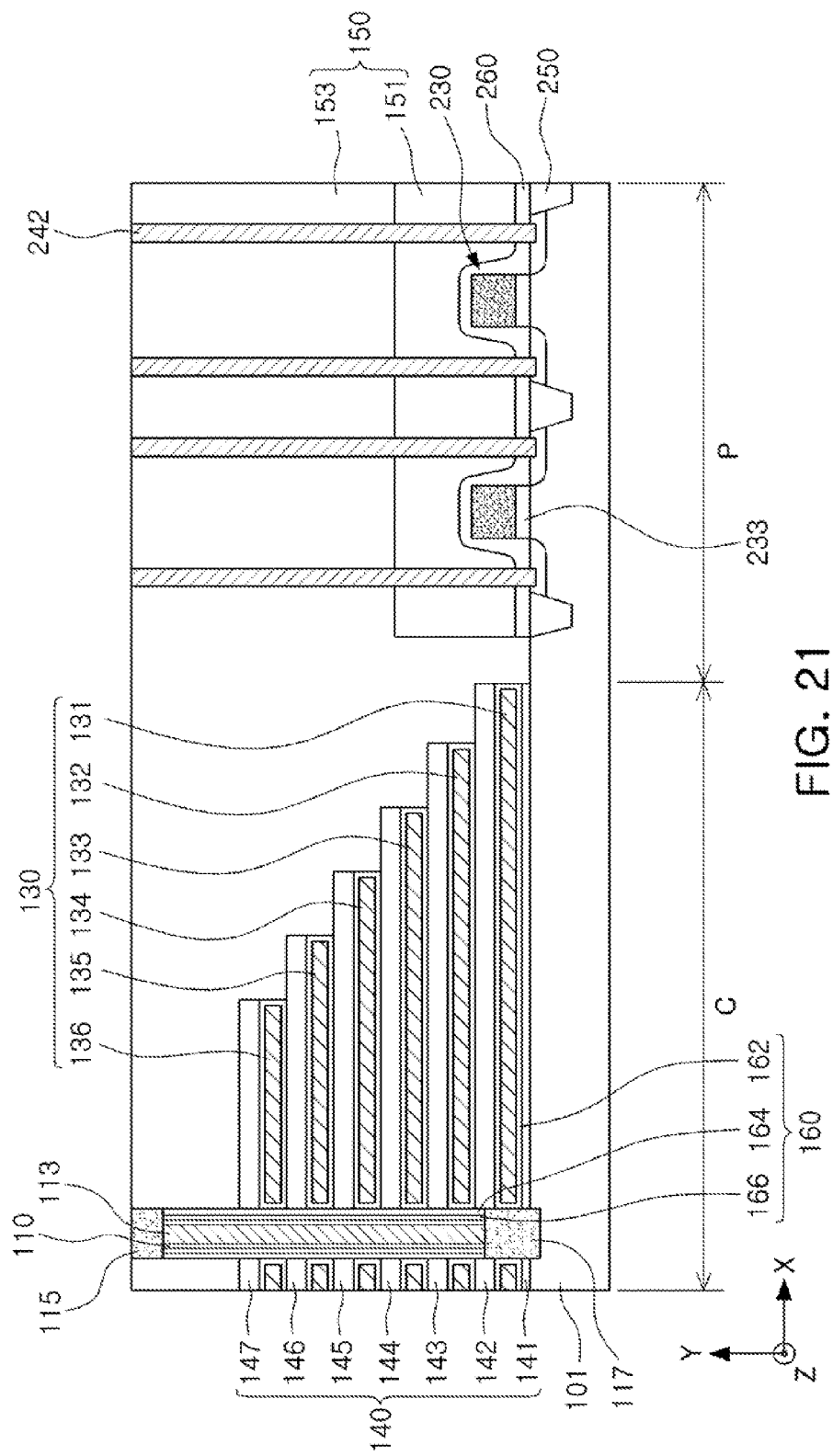

With reference to FIG. 20 illustrating a cross section taken along line I-I' of FIG. 19 and FIG. 21 illustrating a cross section taken along line III-III' of FIG. 19, a ratio of the width W1 of the first active contact 222 and the distance P1 between the first active contacts 222 may be arranged to be within a range of 1:0.5 to 1:1.5, and may be approximately 1:1 in an exemplary embodiment of the present inventive concept. A ratio of the width W2 of the second active contact 242 and the distance P3 between the second active contacts 242 may be determined to be within a range of 1:1.5 to 1:3. In one embodiment, since the widths W1 and W2 of the first and second active contacts 222 and 242 are substantially equal to each other, respectively, the second active contacts 242 may be formed in such a manner that the distance P3 is greater than the distance P1. In some embodiments, the first and second active contacts 222 and 242 may penetrate through the interlayer insulating layer 150 and the cover layer 260 to be extended by depths at which at least portions of the first and second active regions 212 and 232 are recessed, respectively. Also, as can be seen in FIG. 21, for example, the vertical height of the active contacts 222 and 242 may be greater than the height of the vertical channel layers 110. In addition, the vertical height of the active contacts 222 and 242 may be greater than the total vertical height of the stack of gate electrode layers 130 and insulating layers 140.

Figure 22:
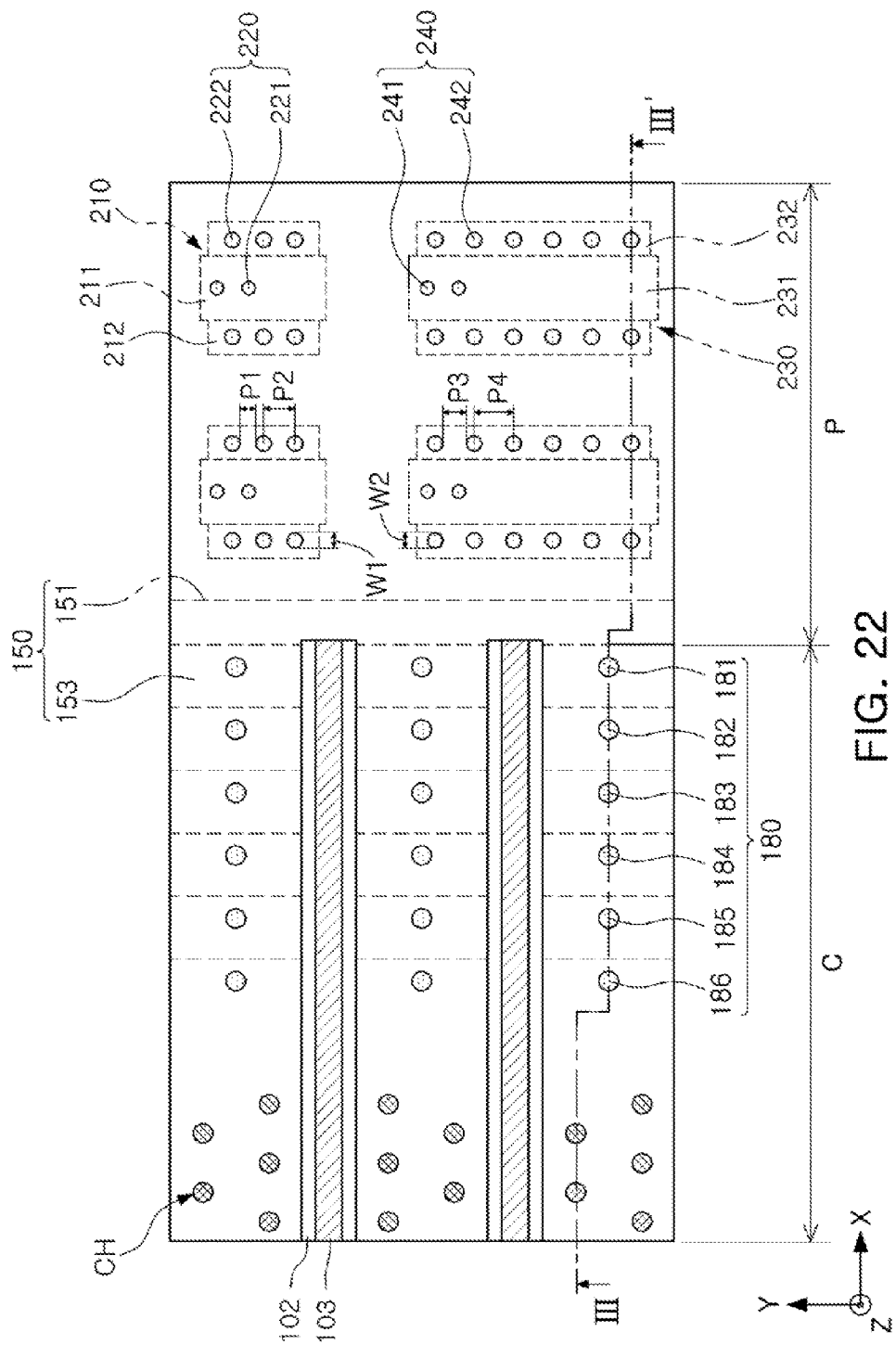
Figure 23:
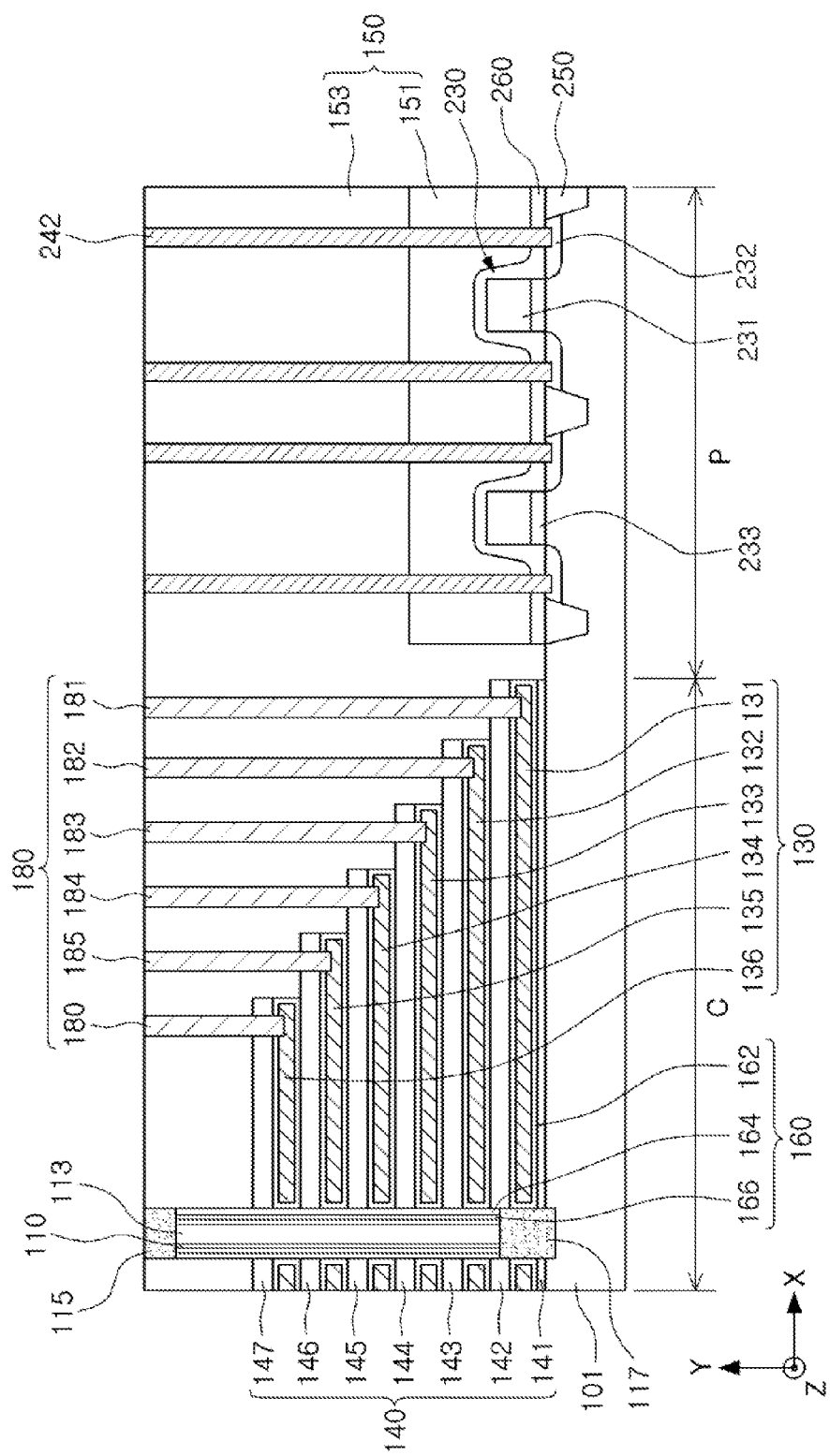

With reference to FIG. 22 and FIG. 23 illustrating a cross section taken along line III-III' of FIG. 22, a plurality of cell contacts 181 to 186 (cell contacts 180) may be formed in the cell region C. The plurality of cell contacts 180 may penetrate through portions of the interlayer insulating layers 150 and the plurality of insulating layers 140 to be connected to the plurality of gate electrode layers 130, respectively. For example, in a case in which blocking layers 162 are respectively disposed externally from the plurality of gate electrode layers 130, the cell contacts 180 may also penetrate through the blocking layers 162, respectively.

Although certain embodiments illustrate the case in which the cell contacts 180 and the peripheral contacts 220 and 240 are formed in a separate process, the cell contacts 180 and the peripheral contacts 220 and 240 may alternatively be formed using a single process. In addition, at least portions of the cell contacts 180 and the peripheral contacts 220 and 240 may have a tapered shape in which widths of the at least portions of the cell contacts 180 and the peripheral contacts 220 and 240 are narrowed toward the substrate 101 to have a tapered shape in a depth direction thereof.

Figure 24:
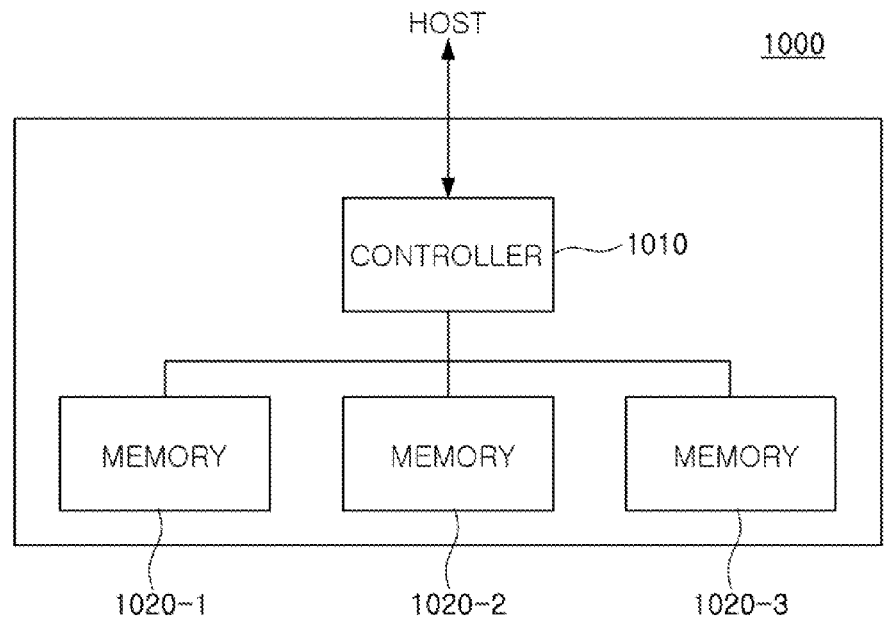
FIGS. 24 and 25 are block diagrams of an electronic device according to certain exemplary embodiments of the present inventive concept.
Figure 25:
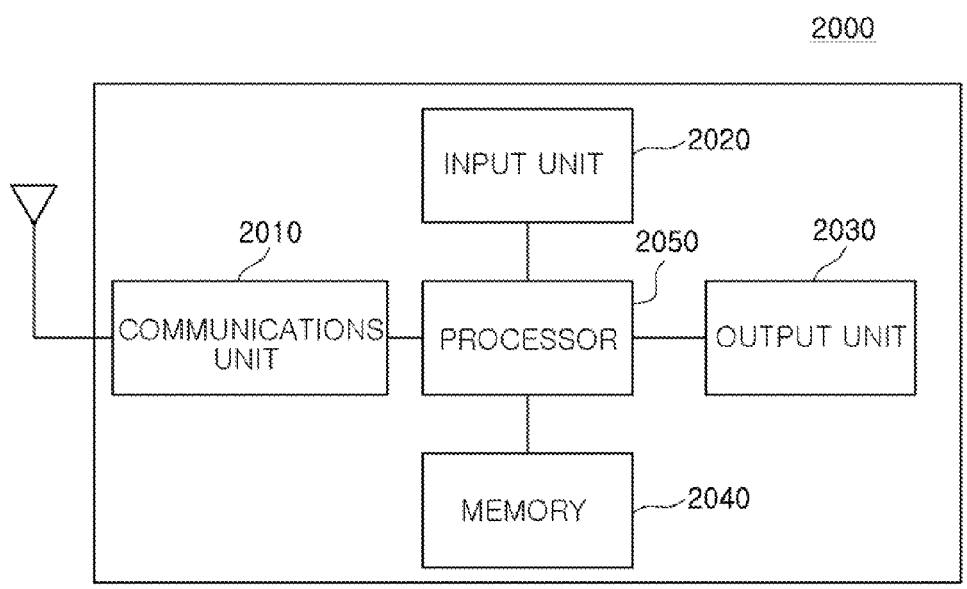

FIGS. 24 and 25 are block diagrams of an electronic device including a memory device according to an exemplary embodiment of the present inventive concept.

With reference to FIG. 24, a storage device 1000 according to an exemplary embodiment may include a controller 1010 communicating with a host HOST and memories 1020-1, 1020-2, and 1020-3 storing data therein. The respective memories 1020-1, 1020-2, and 1020-3 may include a memory device 100 or 300 according to various exemplary embodiments of the present inventive concept as described above.

The host HOST communicating with the controller 1010 may be various electronic devices in which the storage apparatus 1000 is installed, and for example, may be a smartphone, a digital camera, a desktop computer, a laptop computer, a portable media player, or the like. The controller 1010 may receive a data writing or data reading request transferred by the host HOST to enable data to be written to the memories 1020-1, 1020-2, and 1020-3, or may generate a command CMD to allow data to be read from the memories 1020-1, 1020-2, and 1020-3.

As illustrated in FIG. 24, one or more memories 1020-1, 1020-2, and 1020-3 may be connected to the controller 1010 in parallel within the storage apparatus 1000. The storage apparatus 1000 having a large capacity as in a solid state driver (SSD) may be implemented by connecting the plurality of memories 1020-1, 1020-2, and 1020-3 to the controller 1010 in parallel.

With reference to FIG. 25, an electronic device 2000 according to an exemplary embodiment of the present inventive concept may include a communications unit 2010, an input unit 2020, an output unit 2030, a memory 2040, and a processor 2050.

The communications unit 2010 may include a wired and wireless communications module and may include a wireless Internet module, a near-field communications module, a global positioning system (GPS) module, a mobile communications module, and the like. The wired and wireless communications module included in the communications unit 2010 may be connected to an external communications network via various communications protocols to transmit or receive data.

The input unit 2020 may be a module provided to control operations of the electronic device 2000 by a user, and may include a mechanical switch, a touchscreen, a sound recognition module, and the like. In addition, the input unit 2020 may also include a mouse operating in a trackball or laser pointer scheme, or the like, or a finger mouse device, and may further include various sensor modules through which data may be input by a user.

The output unit 2030 may output information processed by the electronic device 2000 in audio or visual form, and the memory 2040 may store a program for processing or controlling by the processor 2050, data, or the like. The memory 2040 may include one or more memory devices 100 and 300 according to various exemplary embodiments of the present inventive concept as described above, and the processor 2050 may transfer a command to the memory 2040 according to a required operation to thus write data thereto or read data therefrom.

The memory 2040 may be embedded in the electronic device 2000 or may communicate with the processor 2050 via a separate interface. In the case of communicating with the processor 2050 via the separate interface, the processor 2050 may write data to the memory 2040 or read data therefrom via various interface standards such as SD, SDHC, SDXC, MICRO SD, USB, and the like.

The processor 2050 may control operations of respective parts included in the electronic device 2000. The processor 2050 may perform controlling and processing relevant to voice communications, video communications, data communications, and the like, or may also perform controlling and processing for multimedia playback and management. In addition, the processor 2050 may process an input transferred through the input unit 2020 by a user and may output the result thereof via the output unit 2030. In addition, the processor 2050 may write data required to control operations of the electronic device 2000 to the memory 2040 or read data therefrom.

As set forth above, with a memory device according to exemplary embodiments of the present inventive concept, informing contacts connected to active regions of peripheral circuit devices, distances between the contacts may be different depending on the size of active regions. Breakage of an interlayer insulating layer occurring between contacts may be prevented by increasing a distance between contacts in larger peripheral circuit devices, and memory device reliability may be increased. This is particularly useful for peripheral circuits in vertical, 3D memory devices, such as 3D NAND, where contacts are typically much longer than in standard 2D NAND devices.

While exemplary embodiments have been shown and described above, it will be apparent to those skilled in the art that modifications and variations could be made without departing from the scope of the present invention as defined by the appended claims.

What is claimed is:

1. A memory device comprising:
   a cell region including memory cells, the cell region including a plurality of channel structures each extending vertically from an upper surface of a substrate, and a plurality of gate electrode layers stacked on the substrate to surround outer surfaces of the plurality of channel structures; and
   a peripheral circuit region including peripheral circuits for the memory cells, the peripheral circuit region including:
      a first active region formed in the substrate,
      a first gate electrode formed on the first active region,
      a first source/drain region formed in the first active region arranged at one side of the first gate electrode,
      a second active region formed in the substrate having an area larger than an area of the first active region,
      a second gate electrode formed on the second active region,
      a second source/drain region formed in the second active region at one side of the second gate electrode,
      a device isolation layer disposed between the first active region and the second active region,
      a plurality of first contacts formed only at the one side of the first gate electrode and connected to the first source/drain region of the first active region, and
      a plurality of second contacts formed only at the one side of the second gate electrode and connected to the second source/drain region of the second active region,
   wherein a pitch between adjacent first contacts of the plurality of first contacts connected to the first source/drain region is less than a pitch between adjacent second contacts of the plurality of second contacts connected to the second source/drain region,
   wherein the first source/drain region is continuous and the second source/drain region is continuous.

2. The memory device of claim 1, wherein a width of each of the plurality of first contacts is substantially equal to a width of each of the plurality of second contacts.

3. The memory device of claim 1, wherein a width of each of the plurality of first contacts is greater than a width of each of the plurality of second contacts.

4. The memory device of claim 1, wherein a ratio of a width of each of the plurality of second contacts to a distance between adjacent contacts of the plurality of second contacts is within a range of 1:1.5 to 1:3.

5. The memory device of claim 4, wherein a ratio of a width of each of the plurality of first contacts to a distance between adjacent ones of the plurality of first contacts is within a range of 1:0.5 to 1:1.5.

6. The memory device of claim 1, wherein:
pitches between adjacent first contacts of the plurality of first contacts connected to the first source/drain region of the first active region are substantially equal to each other; and
pitches between adjacent second contacts of the plurality of second contacts connected to the second source/drain region of the second active region are substantially equal to each other.

7. The memory device of claim 1, wherein the total number of second contacts connected to the second source/chain region of the second active region is greater than or equal to the total number of first contacts connected to the first source/drain region of the first active region.

8. The memory device of claim 1, wherein an area of the first peripheral circuit device is less than an area of the second peripheral circuit device.

9. The memory device of claim 1, wherein each of the first contacts and second contacts has a vertical height greater than a vertical height of the combined plurality of gate electrode layers stacked on the substrate.

10. The memory device of claim 1, wherein the memory cells of the cell region are formed of vertical transistors, and the peripheral circuits include planar transistors formed from the first active region and second active region respectively.

11. The memory device of claim 1, wherein:
the first contacts form a row of at least 3 contacts; and
the second contacts form a row of at least 3 contacts.

12. A memory device comprising:
a plurality of memory cells stacked on an upper surface of a substrate to form a three-dimensional (3D) memory cell array;
a first active region formed in the substrate;
a first gate electrode formed on the first active region;
a first source/drain region formed in the first active region arranged at one side of the first gate electrode;
a second active region formed in the substrate outside of the memory cell array;
a second gate electrode formed on the second active region;
a second source/drain region formed in the second active region at one side of the second gate electrode;
a device isolation layer disposed between the first active region and the second active region;
a plurality of first vertical contacts forming a row of first contacts formed only at the one side of the first gate electrode and connected to the first source/drain region of the first active region, wherein the plurality of first contacts are arranged a first pitch apart from each other; and
a plurality of second vertical contacts forming a row of second contacts formed only at the one side of the second gate electrode and connected to the second source/drain region of the second active region, wherein the plurality of second contacts are arranged a second pitch apart from each other, the second pitch being greater than the first pitch,
wherein the first source/drain region is continuous and the second source/drain region is continuous.

13. The memory device of claim 12, wherein an area of the first active region is less than an area of the second active region.

14. The memory device of claim 13, wherein the number of the plurality of first contacts connected to the first source/drain region of the first active region is less than or equal to the number of the plurality of second contacts connected to the second source/drain region of the second active region.

15. The memory device of claim 12, wherein a ratio of a width of each of the plurality of second contacts to a distance between each of the plurality of second contacts is within a range of 1:1.5 to 1:3.

16. The memory device of claim 15, wherein a ratio of a width of each the plurality of first contacts to a distance between adjacent contacts of the plurality of first contacts is within a range of 1:0.5 to 1:1.5.

17. The memory device of claim 12,
wherein the first active region and the first gate electrode layer are part of a first peripheral circuit device, and the second active region and the second gate electrode layer are part of a second peripheral circuit device.

18. The memory device of claim 12, wherein the plurality of first vertical contacts and plurality of second vertical contacts pass through an interlayer insulating layer that also covers the plurality of memory cells.

19. A memory device comprising:
a substrate;
a channel region extending vertically from an upper surface of the substrate;
a plurality of stacked gate electrode layers adjacent to the channel region and vertically stacked on each other on the substrate;
a plurality of peripheral circuit devices disposed on the substrate outside of a memory cell region that includes the plurality of stacked gate electrode layers; and
an interlayer insulating layer on the plurality of stacked gate electrode layers and the plurality of peripheral circuit devices,
wherein the plurality of peripheral circuit devices include a first peripheral circuit device smaller than a predetermined reference size and a second peripheral circuit device larger than the predetermined reference size, and a pitch between adjacent contacts of a plurality of first contacts connected to a first source/drain region of the first peripheral circuit device is less than a pitch between adjacent contacts of a plurality of second contacts connected to a second source/drain region of the second peripheral circuit device,
wherein the first peripheral circuit device comprises a first gate electrode and the plurality of first contacts are formed only at one side of the first gate electrode, and
wherein the second peripheral circuit device comprises a second gate electrode and the plurality of second contacts are formed only at one side of the second gate electrode,
wherein the first source/drain region is continuous and the second source/drain region is continuous.

20. The memory device of claim 19, wherein the first peripheral circuit device comprises a first active region in which the first source/drain region is formed, the second peripheral circuit device comprises a second active region larger than the first active region in which the second source/drain region is formed.

21. The memory device of claim 19, wherein the number of the plurality of first contacts is less than or equal to the number of the plurality of second contacts.

* * * * *